US012784802B2

(12) United States Patent
Lee

(10) Patent No.: US 12,784,802 B2
(45) Date of Patent: *Nov. 3, 2026

(54) SYSTEMS AND METHODS FOR MAINTAINING REFRESH OPERATIONS OF MEMORY BANKS USING A SHARED ADDRESS PATH

(71) Applicant: Lodestar Licensing Group, LLC, Evanston, IL (US)

(72) Inventor: Joosang Lee, Frisco, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/507,881

(22) Filed: Nov. 13, 2023

(65) Prior Publication Data

US 2024/0194238 A1 Jun. 13, 2024

Related U.S. Application Data

(60) Continuation of application No. 17/083,951, filed on Oct. 29, 2020, now Pat. No. 11,817,143, which is a (Continued)

(51) Int. Cl.
*G11C 11/406* (2006.01)
*G11C 11/408* (2006.01)

(52) U.S. Cl.
CPC .. *G11C 11/40603* (2013.01); *G11C 11/40618* (2013.01); *G11C 11/4082* (2013.01); *G11C 2211/4063* (2013.01)

(58) Field of Classification Search
CPC ........ G11C 11/40603; G11C 11/40618; G11C 11/4082; G11C 2211/4063
See application file for complete search history.

(56) References Cited

U.S. PATENT DOCUMENTS 5,471,430 A 11/1995 Sawada
5,629,897 A 5/1997 Iwamoto
(Continued)

FOREIGN PATENT DOCUMENTS

CN 1973333 A 5/2007
CN 101211653 A 7/2008

OTHER PUBLICATIONS

PCT International Search Report & Written Opinion for PCT Application No. PCT/US2018/046117 Mailed Nov. 28, 2018; 13 Pages.

(Continued)

*Primary Examiner* — Jerome Leboeuf
*Assistant Examiner* — Christopher Lane Reece
(74) *Attorney, Agent, or Firm* — Fletcher Yoder, P.C.

(57) ABSTRACT

A memory device includes memory banks that each has multiple rows with row addresses. The memory device also includes a counter that stores and increments a first row address of a first row of a first set of memory banks to a second row address of a second row of the first set of memory banks in response to a first refresh operation when the memory device is operating in a first mode. The memory device further includes circuitry that blocks incrementing the second row address to a third row address of a third row of the first set of memory banks when the memory device transitions from the first mode to a second mode and the first refresh operation is not paired with a second refresh operation that is performed when the memory device is operating in the first mode.

14 Claims, 10 Drawing Sheets

Related U.S. Application Data division of application No. 16/553,011, filed on Aug. 27, 2019, now Pat. No. 10,825,503, which is a division of application No. 16/192,389, filed on Nov. 15, 2018, now Pat. No. 10,431,288, which is a division of application No. 15/800,267, filed on Nov. 1, 2017, now Pat. No. 10,141,041.

(56) References Cited

U.S. PATENT DOCUMENTS 5,796,669 A * 8/1998 Araki ................ G11C 11/40615 365/236
5,995,404 A * 11/1999 Nakaumura ............. G11C 7/10 365/230.03
7,565,479 B2 7/2009 Best et al.
7,675,800 B2 3/2010 Kawabata
7,692,993 B2 4/2010 Tida et al.
9,576,637 B1 2/2017 Balakrishnan
9,728,245 B2* 8/2017 Bains ................ G11C 11/40611
10,061,541 B1 8/2018 Lee
10,141,041 B1 11/2018 Lee
10,431,288 B2 10/2019 Lee
10,504,580 B2 12/2019 Lee
12,322,431 B2* 6/2025 Gu .................... G11C 11/40611
2002/0071329 A1 6/2002 Tsern
2004/0017714 A1* 1/2004 Lee ...................... G11C 7/1072 365/202
2005/0108460 A1 5/2005 Howard
2006/0018174 A1 1/2006 Park
2007/0033339 A1 2/2007 Best et al.
2007/0086258 A1 4/2007 Freebern
2007/0117317 A1* 5/2007 Ikeda ..................... G11C 5/025 438/257
2008/0225619 A1 9/2008 Kawabata
2008/0253212 A1 10/2008 Iida et al.
2010/0080075 A1* 4/2010 Kunce ................... G11C 11/406 365/230.03
2014/0064008 A1 3/2014 Lee
2014/0064009 A1 3/2014 Lee
2015/0092508 A1 4/2015 Bains
2019/0066766 A1 2/2019 Lee
2022/0406368 A1* 12/2022 Jung ................... G11C 11/4085
2023/0154520 A1* 5/2023 Hatakeyama ..... G11C 11/40615 365/222

OTHER PUBLICATIONS

Chinese Office Action for CN Application No. 201880060226.7, Mailed Feb. 16, 2023, 11 pages.

* cited by examiner

SYSTEMS AND METHODS FOR MAINTAINING REFRESH OPERATIONS OF MEMORY BANKS USING A SHARED ADDRESS PATH

CROSS REFERENCE TO RELATED APPLICATIONS

This application is a continuation of U.S. patent application Ser. No. 17/083,951, entitled "SYSTEMS AND METHODS FOR MAINTAINING REFRESH OPERATIONS OF MEMORY BANKS USING A SHARED ADDRESS PATH," filed Oct. 29, 2020, which is a divisional of U.S. patent application Ser. No. 16/553,011, entitled "SYSTEMS AND METHODS FOR MAINTAINING REFRESH OPERATIONS OF MEMORY BANKS USING A SHARED ADDRESS PATH," filed Aug. 27, 2019, now U.S. Pat. No. 10,825,503 which issued on Nov. 3, 2020, which is a divisional of U.S. patent application Ser. No. 16/192,389, entitled "SYSTEMS AND METHODS FOR MAINTAINING REFRESH OPERATIONS OF MEMORY BANKS USING A SHARED ADDRESS PATH," filed Nov. 15, 2018, now U.S. Pat. No. 10,431,288 which issued on Oct. 1, 2019, which is a divisional of U.S. patent application Ser. No. 15/800,267, entitled "SYSTEMS AND METHODS FOR MAINTAINING REFRESH OPERATIONS OF MEMORY BANKS USING A SHARED ADDRESS PATH," filed Nov. 1, 2017, now U.S. Pat. No. 10,141,041 which issued on Nov. 27, 2018, each of which is hereby incorporated by reference in its entirety for all purposes.

BACKGROUND

Field of the Present Disclosure

Embodiments of the present disclosure relate generally to the field of semiconductor devices. More specifically, embodiments of the present disclosure relate to maintaining refresh operations of memory banks using a shared address path, where a first memory bank may be refreshed while a second memory bank may be accessed using the shared address path.

Description of Related Art

A semiconductor memory device, such as a dynamic random-access memory (DRAM), may refresh a memory cell by periodically reading information from the memory cell and rewriting the read information to the memory cell to preserve the information. For example, each bit of memory data in the memory may be stored as a presence or absence of an electric charge on a capacitor on the memory. As time passes, the electric charge may leak and eventually be lost, unless the data is refreshed. As such, external circuitry may periodically read each memory cell and rewrite the data to the memory cell, restoring the charge on the capacitor to its original level. A memory refresh cycle may refresh a group or area (such as a bank) of memory cells at one time, and each successive cycle may refresh a next group or area of memory cells, thus refreshing all memory cells in the memory. This refresh process may be conducted by a controller of the memory device and/or by a user periodically to keep data in the memory cells.

A memory may include multiple memory banks of memory cells. If a memory bank is being refreshed, then that memory bank may not be accessed (e.g., for read and/or write operations). Some DRAMs, such as a DDR5 SDRAM (double data rate type five synchronous dynamic random access memory), may be capable of refreshing only some memory banks, while enabling access to other memory banks.

Refreshing or accessing a memory bank may be performed by providing a row address on a single address path to the memory circuitry to be refreshed or accessed. The row address to be refreshed may be stored and maintained in a counter (e.g., in the memory) that may be incremented after each time the row address is transmitted to the register. The row address to be accessed may be provided via an external device (e.g., an external controller), along with, for example, an activate command. In either case, the row address may be transmitted and stored in a register of the memory, and the command address input circuit or command decoder may transmit a command to refresh or access the memory bank. Bank control blocks coupled to the memory banks may then perform a refresh or access operation based on the row address stored in the register.

Refreshing may be performed via a number of modes. For example, a memory device may operate in an auto-refresh mode, where the memory device is instructed to refresh externally (e.g., by an external controller). The auto-refresh mode may include FGR (Fine Granularity Refresh) 1× and 2× modes. In an FGR 2× mode, a single refresh command may perform a refresh operation on one or more rows of a memory bank. In an FGR 1× mode, a single refresh command may perform two refresh operations on two sets of rows of the memory bank. Additionally, the memory device may operate in a self-refresh mode, where the memory device is instructed to refresh internally. In the self-refresh mode, the memory device operates similarly as to when operating in the FGR 1× mode.

The command address input circuit or command decoder may transmit a first command that performs a refresh operation on a row (e.g., corresponding to the row address stored in the register) of one or more memory banks. In some circumstances, it may be a rule (e.g., per a semiconductor or memory device manufacturer's specifications) that multiple (e.g., a multiple of two) refresh operations occur before transitioning to another mode. For example, a manufacturer may specify that a memory device operating in the FGR 2× mode perform a multiple of two refresh operations before transitioning to another mode (e.g., the FGR 1× mode or a self-refresh mode). If this specification is violated (e.g., by performing an odd number of refresh operations before transitioning to another mode), a row may not be refreshed, which may lead to memory leakage and/or lost data.

Embodiments of the present disclosure may be directed to one or more of the problems set forth above.

DETAILED DESCRIPTION

Figure 1:
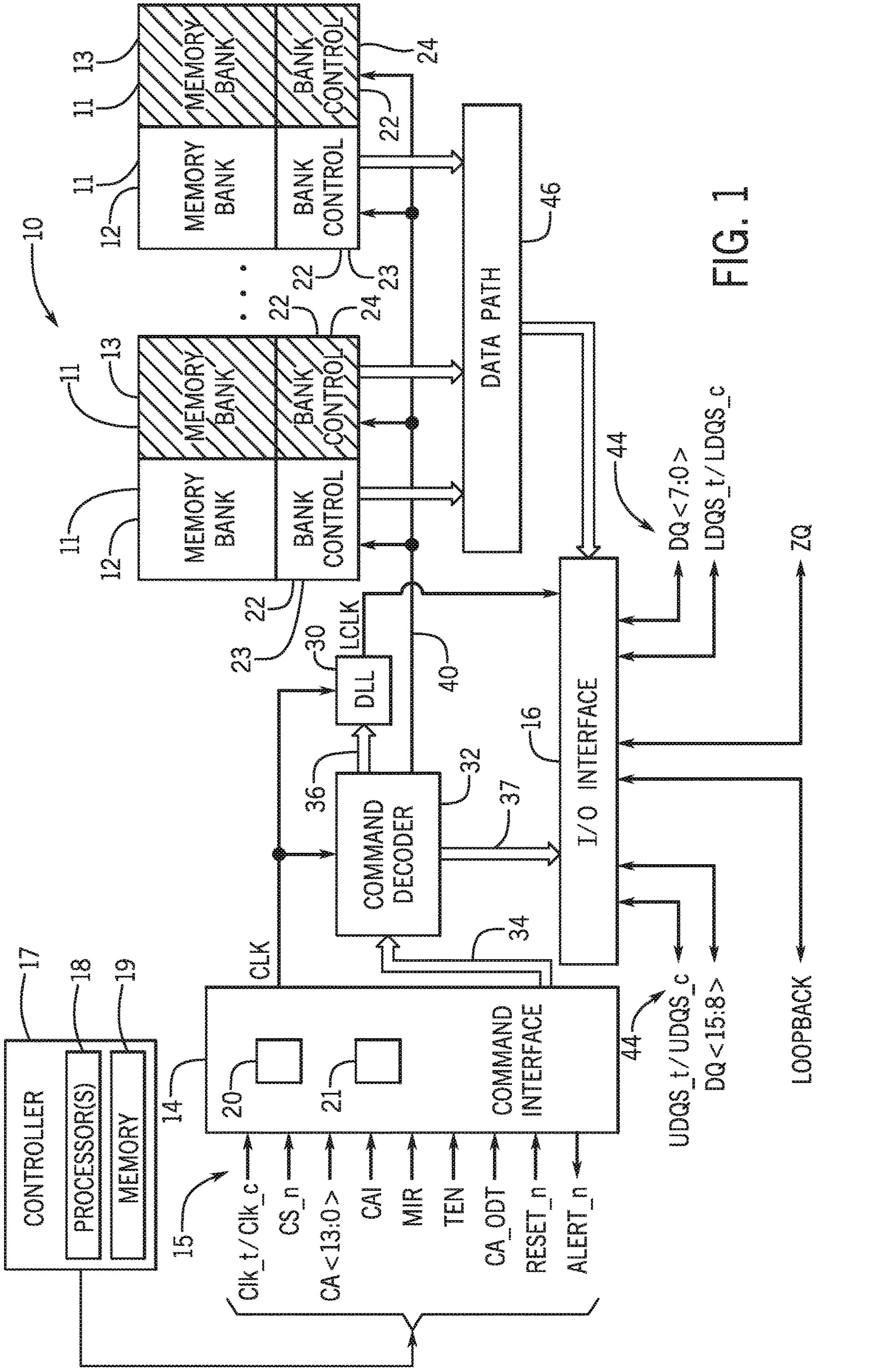
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described in detail below, when a command performs multiple refresh operations on one or more rows of a first set of memory banks, a first set of bank control blocks may capture a row address stored in a register, refresh a first set of rows of the first set of memory banks corresponding to the row address that was captured from the register, increment the captured row address (as opposed to capturing a subsequent row address stored in the register), and refresh a second set of rows of the first set of memory banks corresponding to the row address that captured from the register and incremented. During refresh of the first and second set of rows of the first set of memory banks, a second set of bank control blocks may activate the second set of memory banks. In this manner, the memory device may refresh a first set of memory banks while activating a row of a second set of memory banks to access (e.g., read data from or write data to) the row of the second set of memory banks, while preventing a wrong row of the first set of memory banks from being refreshed or a wrong row of the second memory banks from being activated (and vice versa).

Moreover, a row address output circuit in a memory device may receive a command. When the command refreshes all memory banks of the memory device (e.g., a $REF_{ab}$ command), the row address output circuit outputs a first row address (e.g., stored in a first counter) of a first set of memory banks to be refreshed or a second row address (e.g., stored in a second counter) of a second set of memory banks to be refreshed. Both counters may then be incremented (e.g., to a next row address of the memory banks to be refreshed) if the first row address is the same as the second row address. Otherwise, the second counter may be incremented when the first row address is greater than the second row address, and the first counter may be incremented when the second row address is greater than the first row address. Such an embodiment is described in U.S. patent application Ser. No. 15/676,424, entitled "Systems and Methods for Refreshing a Memory Bank While Accessing Another Memory Bank Using a Shared Address Path," filed Aug. 14, 2017, the contents of which is incorporated by reference in its entirety. In some embodiments, the second counter may be replaced by any suitable latching device, gating device, memory device, storage device, or the like, such as a flip-flop. Such an embodiment is described in U.S. patent application Ser. No. 15/692,804, entitled "Systems and Methods for Refreshing a Memory Bank While Accessing Another Memory Bank Using a Shared Address Path," filed Aug. 31, 2017, the contents of which is incorporated by reference in its entirety.

When the command refreshes the first set of memory banks (e.g., a $REF_{sb}$ command), the row address output circuit outputs the first row address stored in the first counter. The first counter may then be incremented (e.g., to a next row address of the first set of memory banks to be refreshed) if the first row address is less than or equal to the second row address. When the command refreshes the second set of memory banks, the row address output circuit outputs the second row address stored in the second counter. The second counter may then be incremented (e.g., to a next row address of the second set of memory banks to be refreshed) if the second row address is less than or equal to the first row address. When the command activates a first row of the first set of memory banks, the row address output circuit receives and outputs a third row address associated with the first row (e.g., to be read or written to), while the second set of memory banks may be refreshed. Again, the second counter may then be incremented if the second row address is less than or equal to the first row address. Similarly, when the command is configured to activate a second row of the second set of memory banks, the row address output circuit receives and outputs a fourth row address associated with the second row (e.g., to be read or written to), while the first set of memory banks may be refreshed. The first counter may then be incremented if the first row address is less than or equal to the second row address. In this manner, synchronization or pairing of the rows in the memory banks being refreshed may be enforced or maintained.

Turning now to the figures, FIG. 1 is a simplified block diagram illustrating certain features of a semiconductor device (e.g., a memory device 10), according to an embodiment of the present disclosure. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM. While the present disclosure uses the memory device 10 as an example, it should be understood that embodiments of the present disclosure are envisioned to apply to any suitable semiconductor device, such as integrated circuits, transistors, processors, microprocessors, and the like.

The memory device 10, may include a number of memory banks 11. The memory banks 11 may be DDR5 SDRAM memory banks, for instance. The memory banks 11 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 11. The memory device 10 represents a portion of a single memory chip (e.g., SDRAM chip) having a number of memory banks 11. For DDR5, the memory banks 11 may be further arranged to form bank groups. For instance, for an 8 gigabit (Gb) DDR5 SDRAM, the memory chip may include 16 memory banks 11, arranged into 8 bank groups, each bank group including 2 memory banks. For a 16 Gb DDR5 SDRAM, the memory chip may include 32 memory banks 11, arranged into 8 bank groups, each bank group including 4 memory banks, for instance. Various other configurations, organization and sizes of the memory banks 11 on the memory device 10 may be utilized depending on the application and design of the overall system. For example, the memory banks 11 may be divided into sets of memory banks 11, such as even memory banks 12 and odd memory banks 13. It should be understood that references in the present disclosure to the even memory banks 12 should apply equally to the odd memory banks 13, and vice versa.

The memory device 10 may include a command interface 14 and an input/output (I/O) interface 16. The command interface 14 may include processing and/or interface circuitry configured to provide a number of signals (e.g., signals 15) from an external device, such as a controller 17. The controller 17 may include processing circuitry, such as one or more processors 18 (e.g., one or more microprocessors), that may execute software programs to, for example, provide various signals 15 to the memory device 10 to facilitate the transmission and receipt of data to be written to or read from the memory device 10. Moreover, the processor (s) 18 may include multiple microprocessors, one or more "general-purpose" microprocessors, one or more special-purpose microprocessors, and/or one or more application specific integrated circuits (ASICS), or some combination thereof. For example, the processor(s) 18 may include one or more reduced instruction set (RISC) processors. The controller 17 may couple to one or more memories 19 that may store information such as control logic and/or software, look up tables, configuration data, etc. In some embodiments, the processor(s) 18 and/or the memory 19 may be external to the controller 17. The memory 19 may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory 19 may store a variety of information and may be used for various purposes. For example, the memory 19 may store machine-readable and/or processor-executable instructions (e.g., firmware or software) for the processor(s) 18 to execute, such as instructions for providing various signals 15 to the memory device 10 to facilitate the transmission and receipt of data to be written to or read from the memory device 10. As such, the controller 17 may provide various signals 15 to the memory device 10 to facilitate the transmission and receipt of data to be written to or read from the memory device 10.

As will be appreciated, the command interface 14 may include a number of circuits, such as a clock input circuit 20 and a command address input circuit 21, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The I/O interface 16 may include processing and/or interface circuitry configured to manage and/or perform input/output operations between the memory device 10 and any suitable external device coupled to the I/O interface 16.

The clock input circuit 20 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The command decoder 32 may also provide command signals to the I/O interface 16 over bus 37 to facilitate receiving and transmitting I/O signals. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 11 corresponding to the command, via a bus path 40. As will be appreciated, the memory device 10 may include various other decoders, such as row decoders and column decoders, to facilitate access to the memory banks 11. In one embodiment, each memory bank 11 includes a bank control block 22 which provides the necessary decoding (e.g., row decoder and column decoder), as well as other features, such as timing control and data control, to facilitate the execution of commands to and from the memory banks 11. In particular, the bus path 40 may include a row address path that may provide a row address (e.g., sent from the command decoder 32 or one or more counters coupled to the row address path) to the bank control blocks 22 so that the bank control blocks 22 may perform operations on a row corresponding to the row address. The path 40 may be shared by both the command decoder 32 sending a row address on the path 40 to be activated, as well as the counters sending a row address on the path 40 to be refreshed. Similar to the memory banks 11, the bank control blocks 22 may also be divided into sets of bank control blocks 22, such as even bank control blocks 23 associated with the even memory banks 12 and odd bank control blocks 24 associated with the odd memory banks 13. It should be understood that references in the present disclosure to the even bank control blocks 23 should apply equally to the odd bank control blocks 24, and vice versa.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface may include a command address input circuit 21 which is configured to receive and transmit the commands to provide access to the memory banks 11, through the command decoder 32, for instance. In addition, the command interface 14 may receive a chip select signal (CS_n). The CS_n signal enables the memory device 10 to process commands on the incoming CA<13:0> bus. Access to specific banks 11 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 11 over the data path 46, which may include multiple data paths or bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_c), the data strobe (DQS) signals may be provided as a differential pair of data strobe signals (DQS_t/and DQS_c) to provide differential pair signaling during reads and writes. For certain memory devices, such as a DDR5 SDRAM memory device, the differential pairs of DQS signals may be divided into upper and lower data strobe signals (e.g., UDQS_t/and UDQS_c; LDQS_t/and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2:
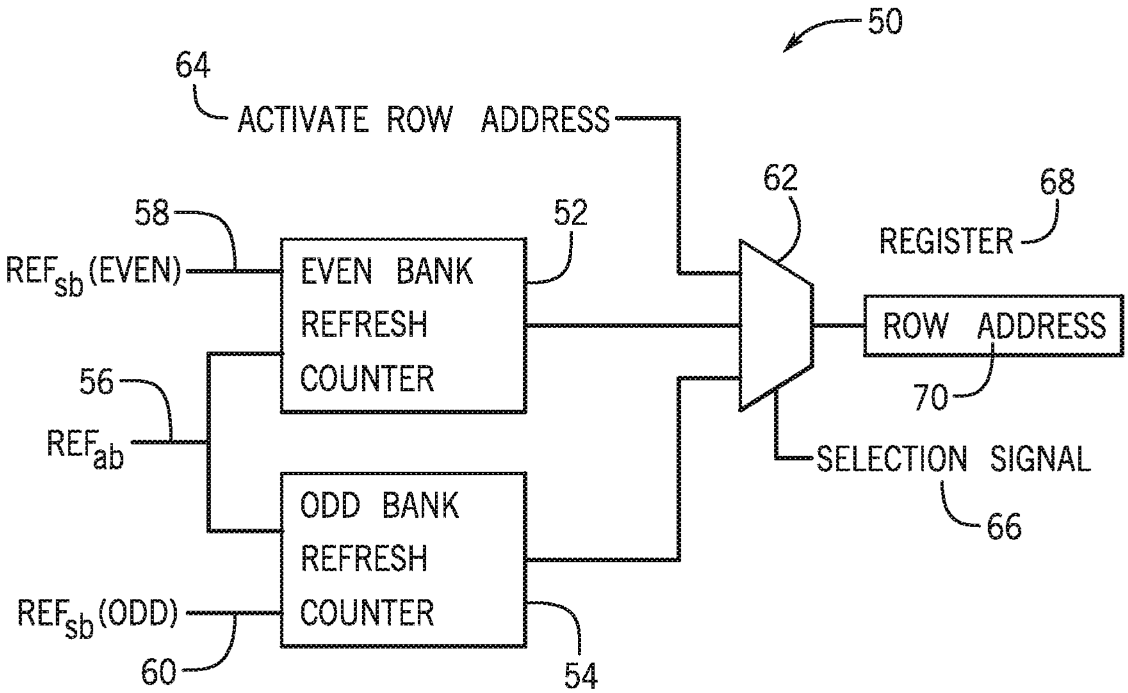
FIG. 2 is a schematic diagram of a row address output circuit of a command address input circuit of the memory device of FIG. 1, according to an embodiment of the present disclosure.

With the foregoing in mind, FIG. 2 is a schematic diagram of a row address output circuit 50 of the command address input circuit 21 of the memory device 10 of FIG. 1, according to an embodiment of the present disclosure. As illustrated, the row address output circuit 50 includes an even bank refresh counter 52 and an odd bank refresh counter 54. It should be understood that references to the even bank refresh counter 52 in the present disclosure may apply equally to the odd bank refresh counter 54, and vice versa.

The even bank refresh counter 52 may store a row address associated with a first set of memory banks (e.g., the even memory banks 12) of the memory device 10 to be refreshed. The even bank refresh counter 52 may increment the stored row address when the row address output circuit 50 receives a $REF_{ab}$ (refresh all memory banks) command 56 or a $REF_{sb}$(Even) (refresh same memory banks—even) command 58. The $REF_{ab}$ command 56 may be transmitted (e.g., by the command interface 14, the external controller 17, or the like) to refresh all memory banks 11, while the $REF_{sb}$ (Even) command 58 may be transmitted to each even bank control block 23 of the memory device 10 to refresh the even memory banks 12 (e.g., separately from the odd memory banks 13). In either case, in response to receiving the $REF_{ab}$ command 56 or the $REF_{sb}$(Even) command 58, each even bank control block 23 may refresh the row address identified by the even bank refresh counter 52 of a respective even memory bank 12 (e.g., corresponding to the even bank control block 23).

Similarly, the odd bank refresh counter 54 may store a row address associated with a second set of memory banks (e.g., the odd memory banks 13) of the memory device 10 to be refreshed. The odd bank refresh counter 54 may increment the stored row address when the row address output circuit 50 receives a $REF_{ab}$ (refresh all memory banks) command 56 or a $REF_{sb}$(Odd) (refresh some memory banks—odd) command 60. The $REF_{sb}$(Odd) command 60 may be transmitted to each odd bank control block 24 of the memory device 10 to refresh the odd memory banks 13 (e.g., separately from the even memory banks 12). In either case, in response to receiving the $REF_{ab}$ command 56 or the $REF_{sb}$(Odd) command 60, each odd bank control block 24 may refresh the row address identified by the odd bank refresh counter 54 of a respective odd memory bank 13 (e.g., corresponding to the odd bank control block 24).

While the even bank refresh counter 52 may store a row address associated with the even memory banks 12 and the odd bank refresh counter 54 may store a row address associated with the odd memory banks 13, it should be understood that the even bank refresh counter 52 may not be dedicated to the even memory banks 12 and the odd bank refresh counter 54 may not be dedicated to the odd memory banks 13. That is, the even bank refresh counter 52 and the odd bank refresh counter 54 may be interchanged, e.g., independent of the contents of the even memory banks 12 and the odd memory banks 13.

A multiplexer 62 of the row address output circuit 50 may accept as inputs the row address stored in the even bank refresh counter 52, the row address stored in the odd bank refresh counter 54, and an activate row address 64 (e.g., associated with a read or write operation). The multiplexer 62 may output one of these inputs based on a selection signal 66. The selection signal 66 may indicate whether the command sent to the row address output circuit 50 is, for example, the $REF_{ab}$ command 56, the $REF_{sb}$(Even) command 58, the $REF_{sb}$(Odd) command 60, an activate command, or the like. The multiplexer 62 may then output the row address stored in the even bank refresh counter 52, the row address stored in the odd bank refresh counter 54, or the activate row address 64 to a register 68 that stores the output as row address 70. The row address 70 may then be captured (e.g., by bank control blocks 22) to perform refresh and/or access (e.g., read/write) operations in the even memory banks 12, the odd memory banks 13, or both.

The bank control blocks 22 may perform any suitable number of refresh operations on any suitable number of rows of respective memory banks 11 (e.g., corresponding to the bank control blocks 22) per refresh command. For example, if the memory device 10 is operating in an FGR (Fine Granularity Refresh) 2× mode, a single refresh command may refresh one or more rows of a memory bank 11. If the memory device is operating in an FGR 1× mode, a single refresh command may perform two refresh operations on two sets of rows of a memory bank 11. As explained below, when a single refresh command performs more than one (e.g., two) refresh operations, one of the refresh operations may be performed at approximately the same time as an activate command, resulting in the refresh operation being performed on the wrong row address or the activate command being performed on the wrong row address.

Figure 3:
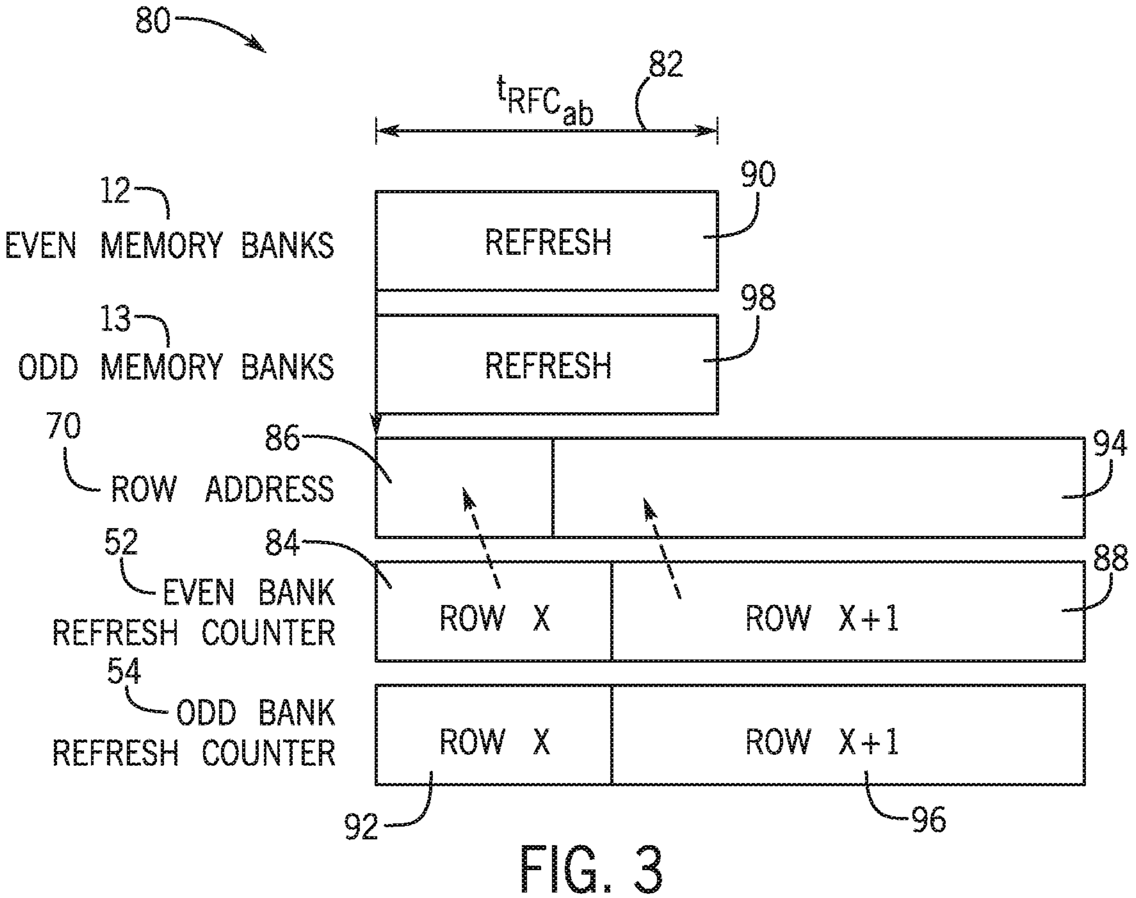
FIG. 3 is an example timing diagram illustrating bank control blocks performing a command that performs one refresh operation on one or more rows of all memory banks of the memory device of FIG. 1 using a shared address path, according to an embodiment of the present disclosure.

FIG. 3 is an example timing diagram 80 illustrating the bank control blocks 22 performing the $REF_{ab}$ command 56 that performs one refresh operation on one or more rows of all memory banks 11 of the memory device 10 of FIG. 1 using a shared address path 40, according to an embodiment of the present disclosure. In particular, the memory device 10 may be operating in the FGR 2× mode. Each refresh operation performed by the $REF_{ab}$ command 56 may take $t_{RFCab}$ ns (nanoseconds) 82. For example, in the case of the memory device 10 operating in the FGR 2× mode, $t_{RFcab}$ 82 may be approximately on the order of 100 ns. In response to receiving the $REF_{ab}$ command 56 (e.g., at the command decoder 32), the even bank control blocks 23 may refresh the even memory banks 12 while (e.g., simultaneously) the odd bank control blocks 24 refresh the odd memory banks 13. Because the even memory banks 12 and the odd memory banks 13 are being refreshed during the $REF_{ab}$ command 56, no memory banks 11 of the memory device 10 may be activated (e.g., for read/write operations).

For example, in response to receiving the $REF_{ab}$ command 56, the row address output circuit 50 may output the row address (i.e., Row X 84) in the even bank refresh counter 52 on the shared address path 40 to store in the register 68 as the row address 70 (i.e., as shown in portion 86) to perform a refresh operation. Both the even bank refresh counter 52 and the odd bank refresh counter 54 may then increment the stored row address (i.e., from Row X 84, 92 to Row X+1 88, 96) to account for Row X 84 of the even memory banks 12 and the odd memory banks 13 being refreshed. The even bank control blocks 23 and the odd bank control blocks 24 may capture the row address 70 (i.e., Row X 84) and refresh 90, 98 the row address 70 in the even memory banks 12 and the odd memory banks 13.

In additional or alternative embodiments, in response to receiving the REFab command 56, the row address output circuit 50 may output the row address (i.e., Row X 92) in the odd bank refresh counter 54 instead of the even bank refresh counter 52 on the shared address path 40 to store in the register 68 as the row address 70. Again, both the even bank refresh counter 52 and the odd bank refresh counter 54 may then increment the stored row address (i.e., from Row X 84, 92 to Row X+1 88, 96) to account for Row X 92 of the even memory banks 12 and the odd memory banks 13 being refreshed.

While the example described in the timing diagram 80 of FIG. 3 illustrates one row (e.g., Row X 84) of the even memory banks 12 and the odd memory banks 13 being refreshed, it should be understood that multiple rows of the even memory banks 12 and the odd memory banks 13 may instead or also be refreshed. In this manner, the bank control blocks 22 may refresh one or more rows of all memory banks 11 of the memory device 10 of FIG. 1 in response to each $REF_{ab}$ command 56 performing one refresh operation.

Figure 4:
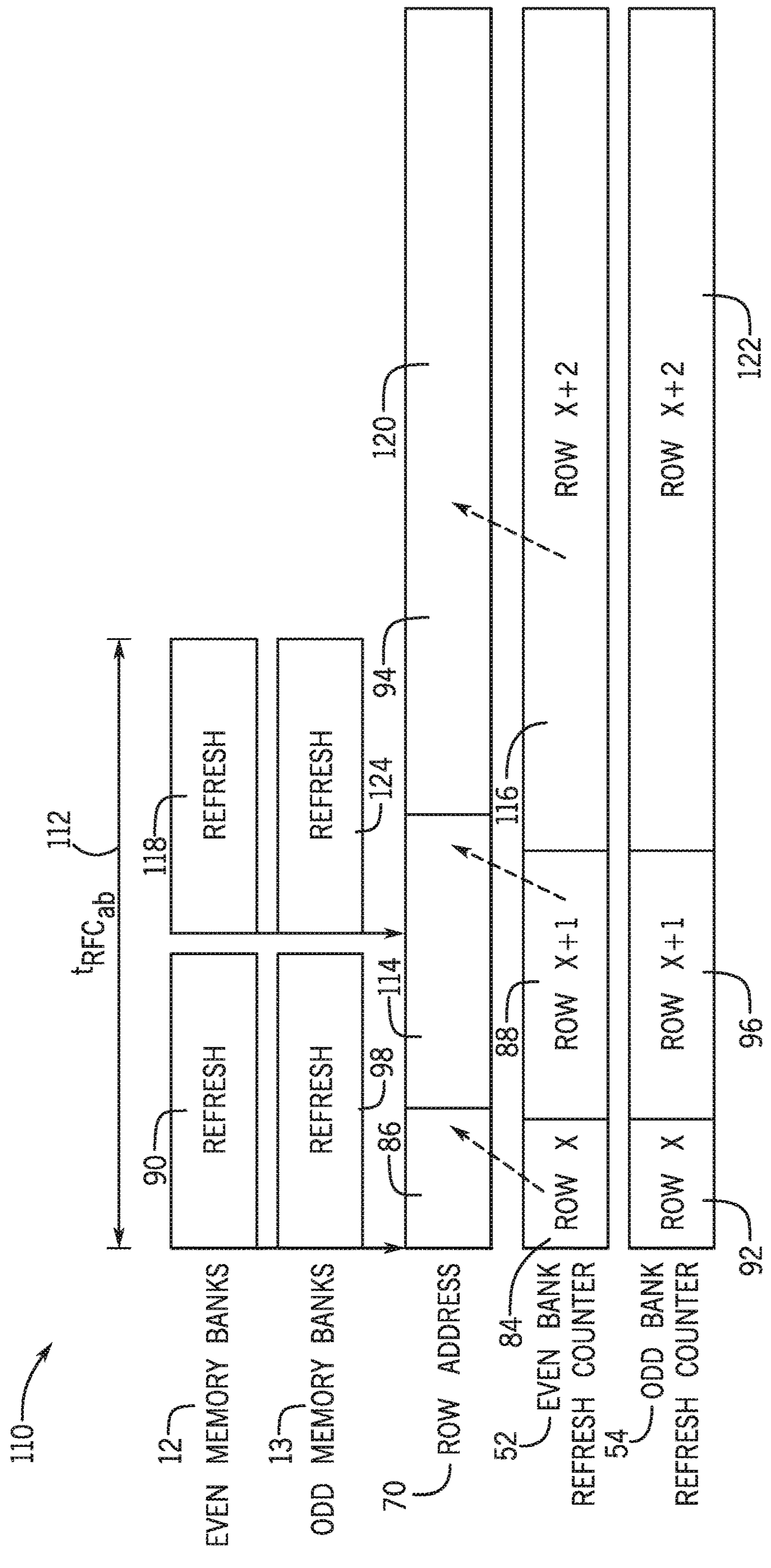
FIG. 4 is an example timing diagram illustrating bank control blocks performing a command that performs multiple refresh operations on one or more rows of all memory banks of the memory device of FIG. 1 using a shared address path, according to an embodiment of the present disclosure.

FIG. 4 is an example timing diagram 110 illustrating the bank control blocks 22 performing the $REF_{ab}$ command 56 by performing multiple refresh operations on one or more rows of all memory banks 11 of the memory device 10 of FIG. 1 using the shared address path 40, according to an embodiment of the present disclosure. In particular, the memory device 10 may be operating in the FGR 1× mode. As such, the bank control blocks 22 may perform two refresh operations on all memory banks 11 of the memory device 10 in response to each $REF_{ab}$ command 56. However, it should be understood that the bank control blocks 22 may perform any suitable number of refresh operations of all memory banks 11 of the memory device 10. As illustrated, the two refresh operations refresh two rows of the memory banks 11. However, it should be understood that the bank control blocks 22 may refresh any suitable number of rows of all memory banks 11 of the memory device 10. Each refresh operation performed by the $REF_{ab}$ command 56 may take $t_{RFCab}$ ns (nanoseconds) 112. For example, in the case of the memory device 10 operating in the FGR 1× mode, $t_{RFCab}$ 112 may be approximately on the order of 195 ns. In response to receiving the $REF_{ab}$ command 56 (e.g., at the command decoder 32), the even bank control blocks 23 may first refresh the even memory banks 12 while (e.g., simultaneously) the odd bank control blocks 24 refresh the odd memory banks 13. As mentioned above, because the even memory banks 12 and the odd memory banks 13 are being refreshed during the $REF_{ab}$ command 56, no memory banks 11 of the memory device 10 may be activated (e.g., for read/write operations).

For example, in response to receiving the $REF_{ab}$ command 56, the row address output circuit 50 may output the row address (i.e., Row X 84) in the even bank refresh counter 52 on the shared address path 40 to store in the register 68 as the row address 70 (i.e., as shown in portion 86) to be captured to perform refresh and/or access (e.g., read/write) operations. The even bank refresh counter 52 and the odd bank refresh counter 54 may then increment the stored row address (i.e., from Row X 84, 92 to Row X+1 88, 96). The even bank control blocks 23 and the odd bank control blocks 24 may capture the row address 70 (i.e., Row X 84) and refresh 90 the row address 70 in the even memory banks 12 and the odd memory banks 13.

When the register 68 is available to store a new row address 70, the row address output circuit 50 may then output the incremented row address (i.e., Row X+1 88) in the even bank refresh counter 52 on the shared address path 40 to store in the register 68 as the row address 70 (i.e., as shown in portion 114) to be captured to perform a refresh operation. The even bank refresh counter 52 and the odd bank refresh counter 54 may then increment the stored row address (i.e., from Row X+1 88, 96 to Row X+2 116, 122). The even bank control blocks 23 and the odd bank control blocks 24 may capture the row address 70 (i.e., Row X+1 88) and refresh 118, 124 the row address 70 in the even memory banks 12 and the odd memory banks 13.

In additional or alternative embodiments, in response to receiving the REFab command 56, the row address output circuit 50 may output the row address (i.e., Row X 92) in the odd bank refresh counter 54 instead of the even bank refresh counter 52 on the shared address path 40 to store in the register 68 as the row address 70. Again, both the even bank refresh counter 52 and the odd bank refresh counter 54 may then increment the stored row address (i.e., from Row X 84, 92 to Row X+1 88, 96) to account for Row X 92 of the even memory banks 12 and the odd memory banks 13 being refreshed.

In such embodiments, when the register 68 is available to store a new row address 70, the row address output circuit 50 may then output the incremented row address (i.e., Row X+1 96) in the odd bank refresh counter 54 on the shared address path 40 to store in the register 68 as the row address 70 to be captured to perform refresh and/or access (e.g., read/write) operations. The even bank refresh counter 52 and the odd bank refresh counter 54 may then increment the stored row address (i.e., from Row X+1 88, 96 to Row X+2 116, 122). The even bank control blocks 23 and the odd bank control blocks 24 may capture the row address 70 (i.e., Row X+1 96) and refresh 118, 124 the row address 70 in the even memory banks 12 and the odd memory banks 13.

In this manner, the bank control blocks 22 may refresh multiple rows of all memory banks 11 of the memory device 10 of FIG. 1 in response to each $REF_{ab}$ command 56 performing multiple refresh operations.

Figure 5:
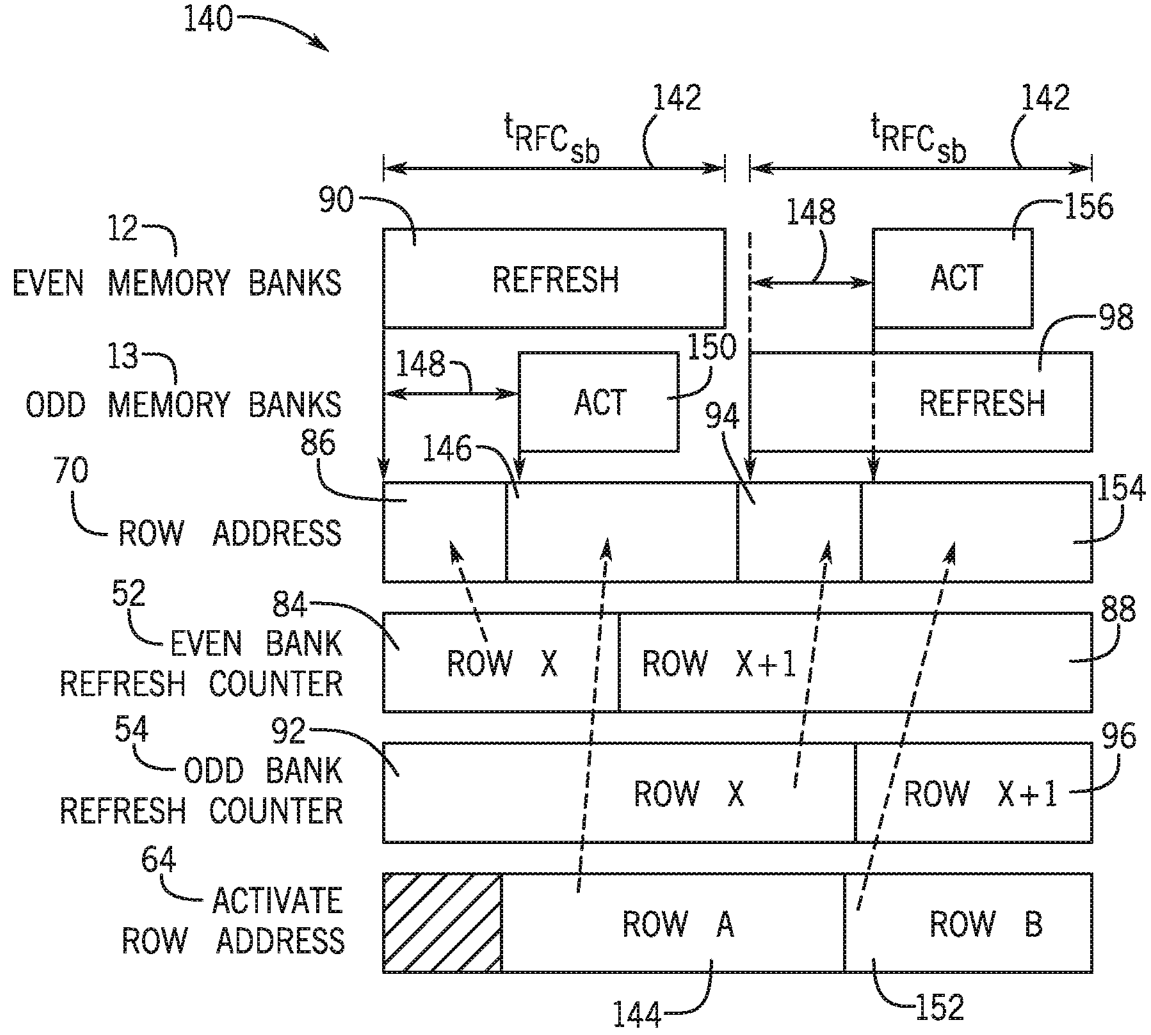
FIG. 5 is an example timing diagram illustrating bank control blocks performing a command that performs one refresh operation on one or more rows of a set (e.g., even or odd) of memory banks of the memory device of FIG. 1 using a shared address path, according to an embodiment of the present disclosure.

FIG. 5 is an example timing diagram 140 illustrating the bank control blocks 22 performing the $REF_{sb}$ command 58, 60 by performing one refresh operation on one or more rows of a set (e.g., even or odd) of memory banks 11 of the memory device 10 of FIG. 1 using the shared address path 40, according to an embodiment of the present disclosure. In particular, the memory device 10 may be operating in the FGR 2× mode. Each refresh operation performed by the $REF_{sb}$ command 58, 60 may take $t_{RFCsb}$ ns (nanoseconds) 142. For example, in the case of the memory device 10 operating in the FGR 2× mode, $t_{RFCsb}$ 142 may be approximately on the order of 100 ns. In response to receiving the $REF_{sb}$(Even) command 58 (e.g., at the command decoder 32), the even bank control blocks 23 may refresh the even memory banks 12. Similarly, in response to receiving the $REF_{sb}$(Odd) command 60 (e.g., at the command decoder 32), the odd bank control blocks 24 may refresh the odd memory banks 13. During a $REF_{sb}$ command 58, 60, while one set of memory banks 11 (e.g., the even memory banks 12) are being refreshed, another set of memory banks 11 (e.g., the odd memory banks 13) may be activated (e.g., for read/write operations).

For example, in response to receiving the $REF_{sb}$(Even) command 58, the row address output circuit 50 may output the row address (i.e., Row X 84) in the even bank refresh counter 52 on the shared address path 40 to store in the register 68 as the row address 70 (i.e., as shown in portion 86) to be captured to perform a refresh operation. The even bank refresh counter 52 may then increment the stored row address (i.e., from Row X 84 to Row X+1 88). The even bank control blocks 23 may capture the row address 70 (i.e., Row X 84) and refresh 90 the row address 70 in the even memory banks 12.

While the refresh operation 90 is performed on the even memory banks 12 via the $REF_{sb}$(Even) command 58, the odd memory banks 13 may be activated (e.g., for read/write operations). For example, in response to receiving an activate (ACT) command (e.g., at the command decoder 32), and when the register 68 is available to store a new row address 70, the row address output circuit 50 may output an activate row address 64 (i.e., Row A 144) of the odd memory banks 13 on the shared address path 40 to store in the register 68 as the row address 70 (i.e., as shown in portion 146) to be captured to perform an access (e.g., read/write) operation. After a delay time 148 (e.g., $t_{RRD}$) associated with a delay between (consecutive) activations, one or more odd bank control blocks 24 may activate 150 the row address 70 (i.e., Row A 144) of one or more odd memory banks 13 to, for example, read from or write to the row address 70. In some embodiments, multiple activate commands may be received and multiple activations 150 may be performed while the refresh operation 90 is performed on the even memory banks 12 via the $REF_{sb}$(Even) command 58 (e.g., depending on the delay 148, the time it takes to perform the activation 150, and the time it takes to perform the refresh operation 90).

In response to receiving the $REF_{sb}$(Odd) command 60, and when the register 68 is available to store a new row address 70, the row address output circuit 50 may also output the row address (i.e., Row X 92) in the odd bank refresh counter 54 on the shared address path 40 to store in the register 68 as the row address 70 (i.e., as shown in portion 94) to be captured to perform a refresh operation. The odd bank refresh counter 54 may then increment the stored row address (i.e., from Row X 92 to Row X+1 96). The odd bank control blocks 24 may capture the row address 70 (i.e., Row X 92) and refresh 98 the row address 70 in the odd memory banks 13.

While the refresh operation 98 is performed on the odd memory banks 13 via the $REF_{sb}$(Odd) command 60, the even memory banks 12 may be activated (e.g., for read/write operations). For example, in response to receiving the activate command (e.g., at the command decoder 32), and when the register 68 is available to store a new row address 70, the row address output circuit 50 may output an activate row address 64 (i.e., Row B 152) of the even memory banks 12 on the shared address path 40 to store in the register 68 as the row address 70 (i.e., as shown in portion 154) to be captured to perform an access (e.g., read/write) operation. After a delay 148 (e.g., $t_{RRD}$), one or more even bank control blocks 23 may activate 156 the row address 70 (i.e., Row B 152) of one or more even memory banks 12 to, for example, read from or write to the row address 70. In some embodiments, multiple activate commands may be received and multiple activations 156 may be performed while the refresh operation 98 is performed on the odd memory banks 13 via the $REF_{sb}$(Odd) command 60 (e.g., depending on the delay 148, the time it takes to perform the activation 156, and the time it takes to perform the refresh operation 98).

While the example described in the timing diagram 140 of FIG. 5 illustrates one row (e.g., Row X 84) of the even memory banks 12 and the odd memory banks 13 being refreshed, it should be understood that multiple rows of the even memory banks 12 and the odd memory banks 13 may instead or also be refreshed. In this manner, the bank control blocks 22 may refresh one row of a set (e.g., even or odd) memory banks 11 of the memory device 10 of FIG. 1 in response to each $REF_{sb}$ command 58, 60 performing one refresh operation.

Figure 6:
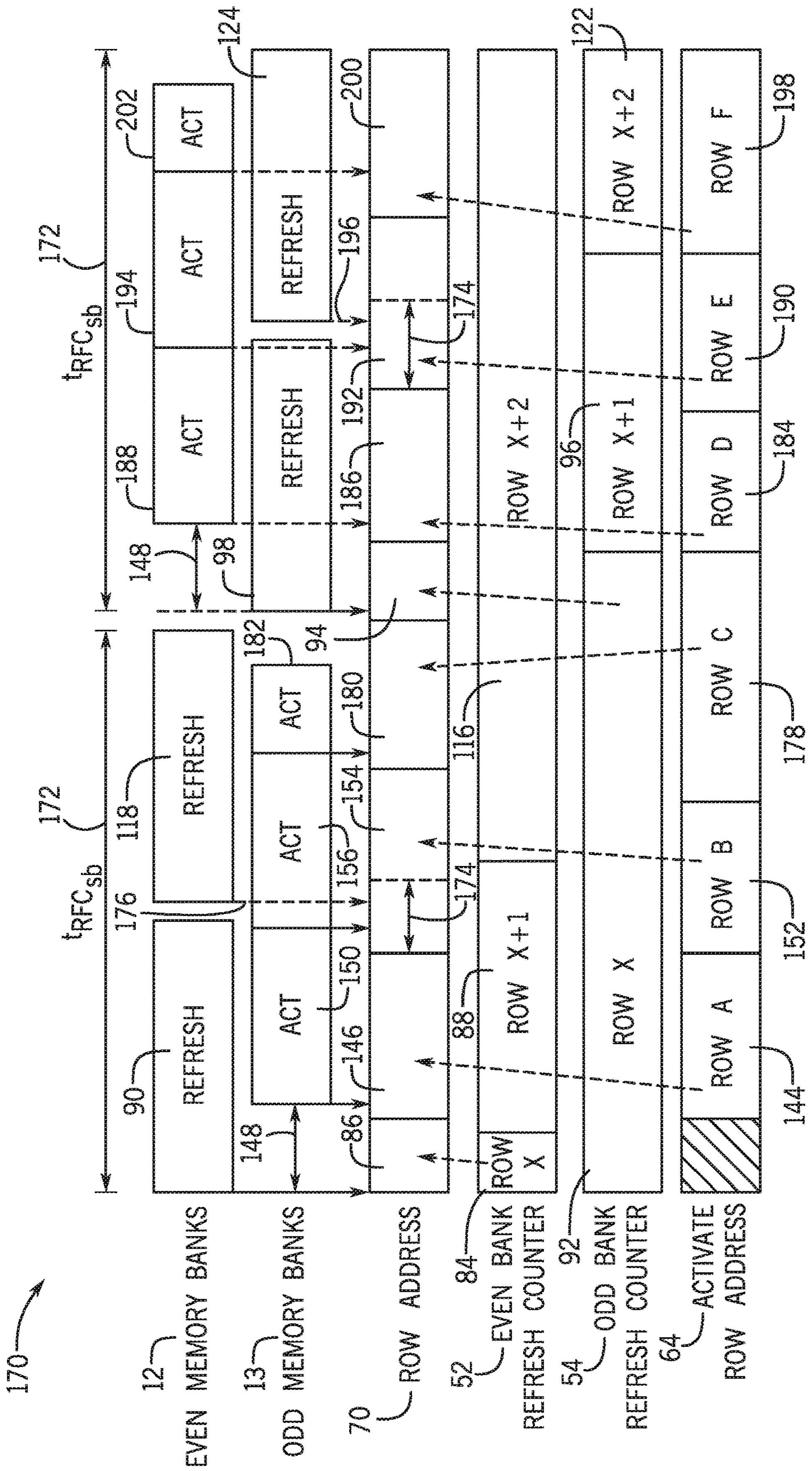
FIG. 6 is an example timing diagram illustrating bank control blocks performing a command that performs multiple refresh operations on one or more rows of a set (e.g., even or odd) of memory banks of the memory device of FIG. 1 using a shared address path, according to an embodiment of the present disclosure.

FIG. 6 is an example timing diagram 170 illustrating the bank control blocks 22 performing the $REF_{sb}$ command 58, 60 by performing multiple refresh operations on one or more rows of a set (e.g., even or odd) of memory banks 11 of the memory device 10 of FIG. 1 using the shared address path 40, according to an embodiment of the present disclosure. In particular, the memory device 10 may be operating in the FGR 1× mode. As such, the bank control blocks 22 may perform two refresh operations on the even memory banks 12 or the odd memory banks 13 of the memory device 10 in response to each $REF_{sb}$ command 58, 60. However, it should be understood that the bank control blocks 22 may perform any suitable number of refresh operations of the even memory banks 12 or the odd memory banks 13 of the memory device 10. As illustrated, the two refresh operations refresh two rows of the even memory banks 12 or the odd memory banks 13. However, it should be understood that the bank control blocks 22 may refresh any suitable number of rows of the even memory banks 12 or the odd memory banks 13 of the memory device 10. Each refresh operation performed by the $REF_{sb}$ command 58, 60 may take $t_{RFCsb}$ ns (nanoseconds) 172 to complete. For example, in the case of the memory device 10 operating in the FGR 1× mode, $t_{RFCsb}$ 172 may be approximately on the order of 130 ns. In response to receiving the $REF_{sb}$(Even) command 58 (e.g., at the command decoder 32), the even bank control blocks 23 may refresh the even memory banks 12. Similarly, in response to receiving the $REF_{sb}$(Odd) command 60 (e.g., at the command decoder 32), the odd bank control blocks 24 may refresh the odd memory banks 13. During a $REF_{sb}$ command 58, 60, while one set of memory banks 11 (e.g., the even memory banks 12) are being refreshed, another set of memory banks 11 (e.g., the odd memory banks 13) may be activated (e.g., for read/write operations).

For example, in response to receiving the $REF_{sb}$(Even) command 58, the row address output circuit 50 may output the row address (i.e., Row X 84) in the even bank refresh counter 52 on the shared address path 40 to store in the register 68 as the row address 70 (i.e., as shown in portion 86) to be captured to perform an access (e.g., read/write) operation. The even bank refresh counter 52 may then increment the stored row address (i.e., from Row X 84 to Row X+1 88). The even bank control blocks 23 may capture the row address 70 (i.e., Row X 84) and refresh 90 the row address 70 in the even memory banks 12.

While the first refresh operation 90 is performed on the even memory banks 12 via the $REF_{sb}$(Even) command 58, the odd memory banks 13 may be activated (e.g., for read/write operations). For example, in response to receiving a first activate command (e.g., at the command decoder 32) corresponding to the odd memory banks 13 when the register 68 is available to store a new row address 70, the row address output circuit 50 may output a first activate row address 64 (i.e., Row A 144) of the odd memory banks 13 on the shared address path 40 to store in the register 68 as the row address 70 (i.e., as shown in portion 146) to be captured to perform an access (e.g., read/write) operation. After a delay time 148 (e.g., $t_{RRD}$), one or more odd bank control blocks 24 may activate 150 the row address 70 (i.e., Row A 144) of one or more odd memory banks 13 to, for example, read from or write to the row address 70.

In some embodiments, multiple activate commands may be received and multiple activations 150 may be performed while the first refresh operation 90 is performed on the even memory banks 12 via the $REF_{sb}$(Even) command 58. In some embodiments, the number of activate command and/or activations 150 may be based at least in part on the delay 148, the time it takes to perform the activation 150, and/or the time it takes to perform the first refresh operation 90. However, in the case of refreshing multiple rows of a set of memory banks 11, such as refreshing two rows of the even memory banks 12 or the odd memory banks 13 in response to a $REF_{sb}$ command 58, 60, a refresh operation of subsequent rows (e.g., a second row) may be performed at or near approximately the same time as an activate command. As a result, and because the shared address path 40 is used (e.g., instead of multiple address paths, where one address path might be used for a refresh operation and another for an activation operation), the wrong address may be captured, and either the refresh operation may be performed on the wrong row address (i.e., the row address of the memory bank to be activated) or the activation operation may be performed on the wrong row address (i.e., the row address of the memory banks to be refreshed). As such, instead of capturing the row address 70 to refresh (e.g., 118) subsequent rows (e.g., a second row) of a set of memory banks 11 (e.g., the even memory banks 12), the bank control blocks 22 (e.g., the even bank control blocks 23) associated with the set of memory banks 11 may internally increment the row address 70 captured during a first refresh operation (e.g., 90).

For example, while the first refresh operation 90 is performed on the even memory banks 12 via the $REF_{sb}$ (Even) command 58, the odd memory banks 13 may be activated a second time. In response to receiving a second activate command (e.g., at the command decoder 32) corresponding to the odd memory banks 13, and when the register 68 is available to store a new row address 70, the row address output circuit 50 may output a second activate row address 64 (i.e., Row B 152) of the odd memory banks 13 on the shared address path 40 to store in the register 68 as the row address 70 (i.e., as shown in portion 154) to be captured to perform an access (e.g., read/write) operation. After a delay 148 (e.g., $t_{RRD}$), one or more odd bank control blocks 24 may activate 156 the row address 70 (i.e., Row B 152) of one or more odd memory banks 13 to, for example, read from or write to the row address 70.

In response to receiving the $REF_{sb}$(Even) command 58, the row address output circuit 50 may output the row address (i.e., Row X+1 88) stored in the even bank refresh counter 52 on the shared address path 40 in an attempt to store Row X+1 88 in the register 68 as the row address 70 (i.e., at the portion 154) to be captured to perform refresh and/or access (e.g., read/write) operations. However, in some instances, the register 68 (e.g., for a duration of time 174) may not be available to store a new row address 70, and instead retains the stored row address (i.e., Row B 152). As such, if the even bank control blocks 23 capture the row address 70 to refresh 118 the row address 70 in the even memory banks 12, the even bank control blocks 23 may capture 176 the row address 70 (i.e., Row B 152) meant for activation in the odd memory banks 13 (instead of Row X+1 88). The even bank control blocks 23 may thus refresh a wrong row in the even memory banks 12.

Instead, rather than capturing 176 the row address 70 and refreshing that row address 70 of the even memory banks 12, the even bank control blocks 23 may internally increment the row address 70 (i.e., from Row X 84 to Row X+1) captured during the first refresh operation 90, and refresh 118 the internally incremented row address (i.e., Row X+1). In this manner, the memory device 10 may refresh the even memory banks 12 while activating a row of the odd memory banks 13, and prevent a wrong row of the even memory banks 12 from being refreshed and/or a wrong row of the odd memory banks 13 from being activated. The even bank refresh counter 52 may then increment the stored row address (i.e., from Row X+1 88 to Row X+2 116) to account for the internally incremented row address 70 associated with the even memory banks 12. To reduce complexity in the circuitry of the memory device 10, in some embodiments, the command interface 14, the command address input circuit 21, the command decoder 32, and/or the bank control blocks 22 may guarantee that the first refresh operation 90 is performed on an even row address 70 (i.e., Row X 84), such that the least significant bit of the even row address 70 is 0. This way, internally incrementing the row address 70 is simply a matter of flipping the least significant bit (to 1).

While the first refresh operation 90 is performed on the even memory banks 12 via the $REF_{sb}$(Even) command 58, the odd memory banks 13 may be activated a third time. In response to receiving a third activate command (e.g., at the command decoder 32) corresponding to the odd memory banks 13, and when the register 68 is available to store a new row address 70, the row address output circuit 50 may output a third activate row address 64 (i.e., Row C 178) of the odd memory banks 13 on the shared address path 40 to store in the register 68 as the row address 70 (i.e., as shown in portion 180) to be captured to perform an access (e.g., read/write) operation. After a delay time 148 (e.g., $t_{RRD}$) associated with a delay between (consecutive) activations, one or more odd bank control blocks 24 may activate 182 the row address 70 (i.e., Row C 178) of one or more odd memory banks 13 to, for example, read from or write to the row address 70.

In response to receiving the $REF_{sb}$(Odd) command 60, the row address output circuit 50 may output the row address (i.e., Row X 92) in the odd bank refresh counter 54 on the shared address path 40 to store in the register 68 as the row address 70 (i.e., as shown in portion 94) to be captured to perform a refresh operation. As illustrated, if only a single counter (e.g., the even refresh counter 52) were used instead of two counters (e.g., the even refresh counter 52 and the odd refresh counter 54), the row address output circuit 50 might not be able to output the correct row (i.e., Row X). That is, because the even refresh counter 52 was incremented (e.g., to Row X+1 88) to prepare for the second refresh operation 118 for the even memory banks 12, it no longer stores the correct row (e.g., Row X) for the odd memory banks 13 to refresh. The odd bank refresh counter 54 may then increment the stored row address (i.e., from Row X 92 to Row X+1 96). The odd bank control blocks 24 may capture the row address 70 (i.e., Row X 92) and refresh 98 the row address 70 in the odd memory banks 13.

While the first refresh operation 98 is performed on the odd memory banks 13 via the $REF_{sb}$(Odd) command 60, the even memory banks 12 may be activated (e.g., for read/write operations). For example, in response to receiving a first activate command (e.g., at the command decoder 32) corresponding to the even memory banks 12, and when the register 68 is available to store a new row address 70, the row address output circuit 50 may output a first activate row address 64 (i.e., Row D 184) of the even memory banks 12 on the shared address path 40 to store in the register 68 as the row address 70 (i.e., as shown in portion 186) to be captured to perform an access (e.g., read/write) operation.

After a delay 148 (e.g., $t_{RRD}$), one or more even bank control blocks 23 may activate 188 the row address 70 (i.e., Row D 184) of one or more even memory banks 12 to, for example, read from or write to the row address 70.

While the first refresh operation 90 is performed on the odd memory banks 13 via the $REF_{sb}$(Odd) command 60, the even memory banks 12 may be activated a second time. In response to receiving a second activate command (e.g., at the command decoder 32) corresponding to the even memory banks 12, and when the register 68 is available to store a new row address 70, the row address output circuit 50 may output a second activate row address 64 (i.e., Row E 190) of the even memory banks 12 on the shared address path 40 to store in the register 68 as the row address 70 (i.e., as shown in portion 192) to be captured to perform an access (e.g., read/write) operation. After a delay 148 (e.g., $t_{RRD}$), one or more even bank control blocks 23 may activate 194 the row address 70 (i.e., Row D 184) of one or more even memory banks 12 to, for example, read from or write to the row address 70.

In response to receiving the $REF_{sb}$(Odd) command 60, the row address output circuit 50 may output the row address (i.e., Row X+1 96) stored in the odd bank refresh counter 54 on the shared address path 40 in an attempt to store Row X+1 96 in the register 68 as the row address 70 (i.e., at the portion 186) to be captured to perform refresh and/or access (e.g., read/write) operations. However, in some instances, the register 68 (e.g., for a duration of time 174) may not be available to store a new row address 70, and instead retains the stored row address (i.e., Row D 184). As such, if the odd bank control blocks 24 capture the row address 70 to refresh 124 the row address 70 in the odd memory banks 13, the odd bank control blocks 24 may capture 196 the row address 70 (i.e., Row D 184) meant for activation in the even memory banks 12 (instead of Row X+1 96). The odd bank control blocks 24 may thus refresh a wrong row in the odd memory banks 13.

Instead, rather than capturing 196 the row address 70 and refreshing that row address 70 of the odd memory banks 13, the odd bank control blocks 24 may internally increment the row address 70 (i.e., from Row X 92 to Row X+1) captured during the first refresh operation 98, and refresh 124 the internally incremented row address (i.e., Row X+1). In this manner, the memory device 10 may refresh the odd memory banks 13 while activating a row of the even memory banks 12, and prevent a wrong row of the odd memory banks 13 from being refreshed or a wrong row of the even memory banks 12 from being activated. The odd bank refresh counter 54 may then increment the stored row address (i.e., from Row X+1 96 to Row X+2 122) to account for the internally incremented row address 70 associated with the odd memory banks 13. To reduce complexity in the circuitry of the memory device 10, in some embodiments, the command interface 14, the command address input circuit 21, the command decoder 32, and/or the bank control blocks 22 may guarantee that the first refresh operation 98 is performed on an even row address 70 (i.e., Row X 92), such that the least significant bit of the even row address 70 is 0. This way, internally incrementing the row address 70 is simply a matter of flipping the least significant bit (to 1).

While the first refresh operation 98 is performed on the odd memory banks 13 via the $REF_{sb}$(Odd) command 60, the even memory banks 12 may be activated a third time. In response to receiving a third activate command (e.g., at the command decoder 32) corresponding to the even memory banks 12, and when the register 68 is available to store a new row address 70, the row address output circuit 50 may output a third activate row address 64 (i.e., Row F 198) of the even memory banks 12 on the shared address path 40 to store in the register 68 as the row address 70 (i.e., as shown in portion 200) to be captured to perform refresh and/or access (e.g., read/write) operations. After a delay 148 (e.g., $t_{RRD}$), one or more even bank control blocks 23 may activate 202 the row address 70 (i.e., Row F 198) of one or more even memory banks 12 to, for example, read from or write to the row address 70.

In this manner, the memory device 10 may refresh a first set of memory banks 11 while activating a row of a second set of memory banks 11 to access (e.g., read data from or write data to) the row of the second set of memory banks 11, while preventing a wrong row of the first set of memory banks 11 from being refreshed or a wrong row of the second memory banks 11 from being activated (and vice versa). In some embodiments, when performing the $REF_{ab}$ command 56 by performing multiple refresh operations of all memory banks 11 of the memory device 10 as shown in FIG. 4, rather than capturing the row address 70 and refreshing that row address 70 of the memory banks 11, the bank control blocks 22 may internally increment the row address 70 (e.g., Row X 84) captured during a first refresh operation (e.g., 90), and refresh (e.g., 118) the internally incremented row address (e.g., Row X+1).

The memory device 10 may perform refresh operations via a number of modes. For example, the memory device 10 may operate in an auto-refresh mode, where the memory device 10 is instructed to refresh externally (e.g., by an external controller). The auto-refresh mode may include FGR (Fine Granularity Refresh) 1× and 2× modes. In an FGR 2× mode, a single refresh command may perform a refresh operation on one or more rows of a memory bank 11. In an FGR 1× mode, a single refresh command may perform two refresh operations on two sets of rows of the memory bank 11. Additionally, the memory device 10 may operate in a self-refresh mode, where the memory device 10 is instructed to refresh internally. In the self-refresh mode, the memory device 10 operates similarly as to when operating in the FGR 1× mode.

The command address input circuit 21 or command decoder 32 may transmit a first command that performs a refresh operation on a row (e.g., corresponding to the row address stored in the register) of one or more memory banks 11. In some circumstances, it may be a rule (e.g., per a semiconductor or memory device manufacturer's specifications) that multiple (e.g., a multiple of two) refresh operations occur before transitioning to another mode. For example, a manufacturer may specify that a memory device 10 operating in the FGR 2× mode perform a multiple of two refresh operations before transitioning to another mode (e.g., the FGR 1× mode or the self-refresh mode). If this specification is violated (e.g., by performing one refresh operation before transitioning to another mode), a row may not be refreshed, which may lead to memory leakage and/or lost data.

Figure 7:
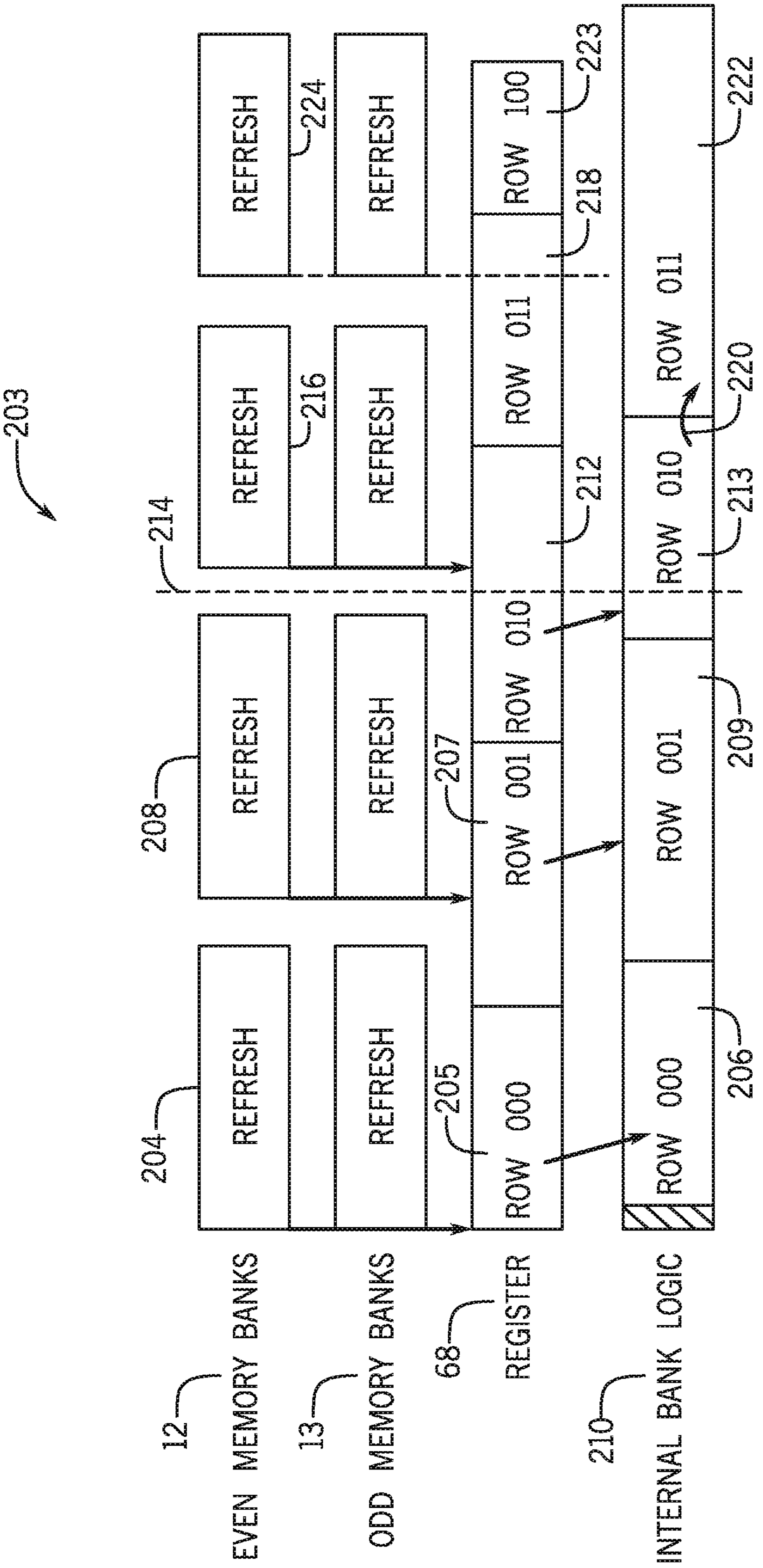
FIG. 7 is an example timing diagram illustrating the memory device of FIG. 1 maintaining the specification of performing two refresh operations before transitioning from operating in an FGR 2× mode to operating in an FGR 1× mode or a self-refresh mode, according to an embodiment of the present disclosure.

FIG. 7 is an example timing diagram 203 illustrating the memory device 10 of FIG. 1 maintaining the specification of performing two refresh operations before transitioning from operating in the FGR 2× mode to operating in the FGR 1× mode or the self-refresh mode, according to an embodiment of the present disclosure. In particular, the memory device 10 may be operating in the FGR 2× mode when performing a first FGR 2× mode refresh operation 204. In the FGR 2× mode, a single refresh command may perform a refresh operation on one or more rows of a memory bank. For example, the bank control blocks 22 may refresh Row 000

(which may be stored in the register 68 as the row address 70) of all memory banks 11. It should be understood that while FIG. 7 illustrates using a refresh all memory banks ($REF_{ab}$) command (prior to transitioning to operating in the FGR 1× mode or the self-refresh mode), this example timing diagram may apply similarly to a refresh same memory banks ($REF_{sb}$) command operating in the FGR 2× mode. To reduce complexity in the circuitry of the memory device 10, in some embodiments, the command interface 14, the command address input circuit 21, the command decoder 32, and/or the bank control blocks 22 may guarantee that the first FGR 2× mode refresh operation 204 is performed on an even row address, such that the least significant bit of the even row address 70 is 0. This way, internally incrementing the row address 70 is simply a matter of flipping the least significant bit (to 1) in FGR 1× mode to avoid row address conflicts between refreshing even memory banks 12 and activating odd memory banks 13, and vice versa.

As illustrated, the first FGR 2× mode refresh operation 204 is performed on the row address 000 (as shown in portion 205). It should be understood that while three bits are used to illustrate the row address in FIG. 7, the number of bits used is an example. Any suitable number of bits (e.g., 0-100) may be used to represent the row address. Moreover, in the illustrated example, the least significant bit is the third (last) bit of the row address. However, it should be understood that the least significant bit may be any suitable bit, including a first bit, an intermediate bit, and the like. The row address 000 may be stored in internal bank logic 210 in portion 206.

After the first FGR 2× mode refresh operation 204 is performed, the row address 000 in the register 68 may be incremented to row address 001 (as shown in portion 207). As illustrated, a second FGR 2× mode refresh operation 208 is performed on the row address 001 in portion 207. The row address 001 may be stored in internal bank logic 210 in portion 209. After the second FGR 2× mode refresh operation 208 is performed, the row address 001 in the register 68 may be incremented to row address 010 (as shown in portion 212).

The memory device 10 may then transition to operating in the FGR 1× mode (as indicated by dashed line 214) by, for example, using a mode register command or a self-refresh entry command. Because a multiple of two FGR 2× mode refresh operations were performed before transitioning to the FGR 1× mode, the specification is not violated. In the FGR 1× mode, a single refresh command may perform two refresh operations on two sets of rows of the memory bank. As illustrated, the bank control blocks 22 may perform a first FGR 1× mode refresh operation 216 to refresh Row 010 (as shown in portion 212) of the memory banks 11 after the memory device 10 transitions to the FGR 1× mode. It should be understood that while FIG. 7 illustrates using a refresh all memory banks ($REF_{ab}$) command (after transitioning to operating in the FGR 1× mode or the self-refresh mode), the example timing diagram 203 applies similarly to a refresh same memory banks ($REF_{sb}$) command operating in the FGR 1× mode or the self-refresh mode. The row address 010 may be stored in internal bank logic 210 in portion 213.

After the first FGR 1× mode refresh operation 216 is performed, the row address 010 in the register 68 (in portion 213) may be incremented to row address 011 (as shown in portion 218). Moreover, the bank control blocks 22 may internally increment (as shown by arrow 220) the row address 010 stored in the internal bank logic 210 to 011 by flipping the least significant bit (to 1) and store the row address 011 in internal bank logic 210 (as shown in portion 222). The bank control blocks 22 may then perform a second FGR 1× mode refresh operation 224 to read row address 011 from the portion 222 of internal bank logic 210 and refresh that row of the memory banks 11. In some embodiments, the bank control blocks 22 may capture a new row address in the register 68 or internally increment the row address in the internal bank logic 210 to be refreshed. After second FGR 1× mode refresh operation 224 is performed, the row address 011 in the register 68 (in portion 218) may be incremented to row address 100 (as shown in portion 223).

Figure 8:
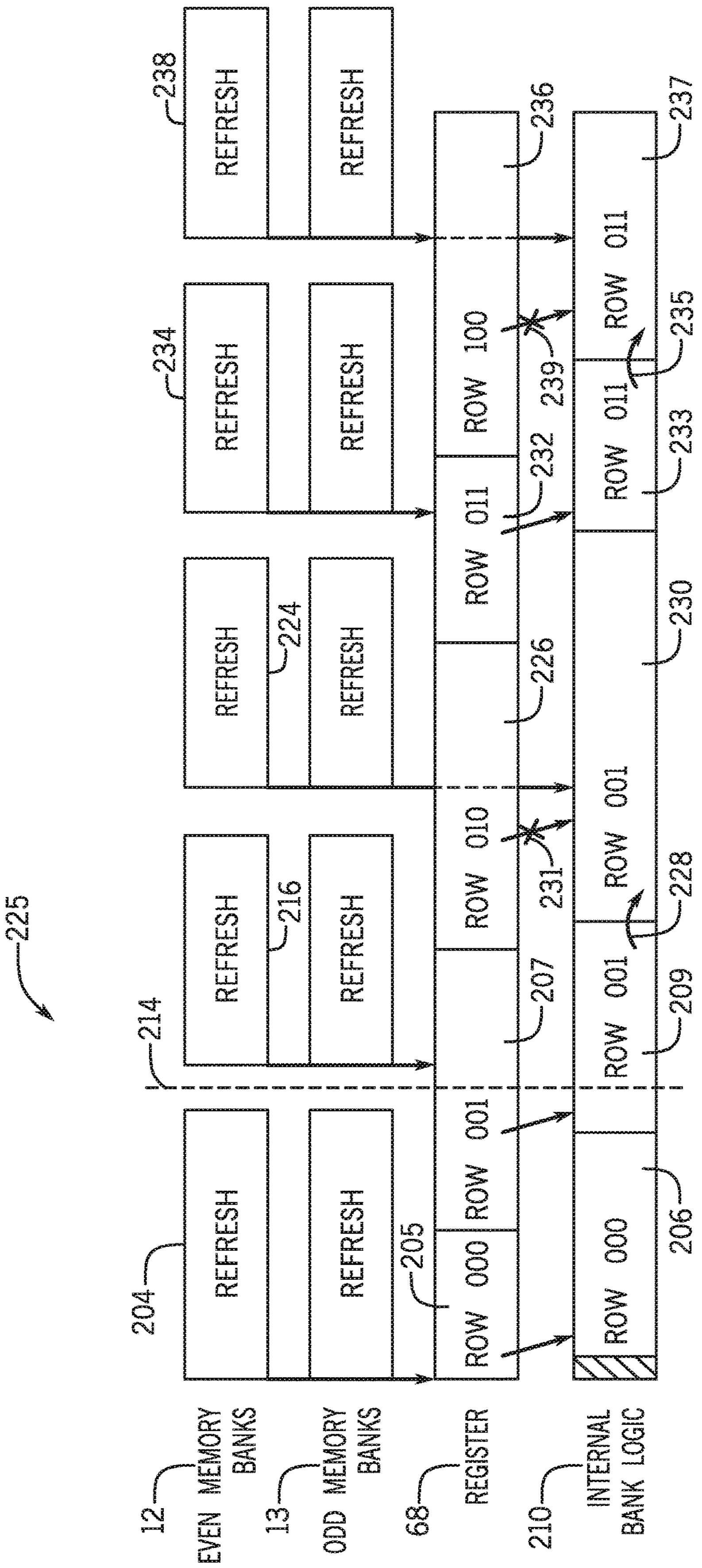
FIG. 8 is an example timing diagram illustrating the memory device of FIG. 1 violating the specification of performing two refresh operations before transitioning from operating in an FGR 2× mode to operating in an FGR 1× mode or a self-refresh mode, according to an embodiment of the present disclosure.

FIG. 8 is an example timing diagram 225 illustrating the memory device 10 of FIG. 1 violating the specification of performing two refresh operations before transitioning from operating in the FGR 2× mode to operating in the FGR 1× mode or the self-refresh mode, according to an embodiment of the present disclosure. In particular, the memory device 10 may be operating in the FGR 2× mode when performing the first FGR 2× mode refresh operation 204. As illustrated, the bank control blocks 22 may refresh row address 000 (which may be stored in the portion 205 of the register 68 as the row address 70) of all memory banks 11. The row address 000 may also be stored in internal bank logic 210 in portion 206.

After the first FGR 2× mode refresh operation 204 is performed, the row address 000 in the register 68 may be incremented to row address 001 (as shown in portion 207). Without performing a second FGR 2× mode refresh operation, the memory device 10 may transition to operating in the FGR 1× mode (as indicated by dashed line 214), violating the specification. In particular, the bank control blocks 22 may perform a first FGR 1× mode refresh operation 216 to refresh Row 001 (as shown in portion 207) of the memory banks 11 after the memory device 10 transitions to the FGR 1× mode. The row address 001 may also be stored in internal bank logic 210 in portion 209.

After the first FGR 1× mode refresh operation 216 is performed, the row address 001 in the register 68 may be incremented to row address 010 (as shown in portion 226). Moreover, the bank control blocks 22 may attempt to internally increment (as shown by 228) the row address 001 stored in the portion 209 of the internal bank logic 210 by flipping the least significant bit (to 1) and store the resulting row address in internal bank logic 208 (in portion 230). This is to ensure that a first set of memory banks may be properly refreshed while a second set of memory banks is properly activated. As such, the row address 010 in portion 226 of the register 68 is not stored in the internal bank logic 210, as indicated by crossed-out arrow 231. However, because the row address 001 already has a least significant bit of 1, flipping the least significant bit of 001 to 1 does not change the value of the row address 001. As such, the bank control blocks 22 may simply perform a second FGR 1× mode refresh operation 224 on the row address 001 of the memory banks 11.

That is, as discussed in relation to FIG. 6, because the second FGR 1× mode refresh operation 224 captures the row address from the internal bank logic 210 that was internally incremented to avoid data collisions with capturing activate row addresses in other memory banks, and because the row address to be internally incremented already had a last significant bit of 1, the row address may be refreshed twice. Significantly, as a result, a next refresh operation (after the second FGR 1× mode refresh operation 224) may skip the next row address altogether. For example, the row address 010 in portion 226 of the register 68 may further be incremented to row address 011 as shown in portion 232. The row address 011 stored in portion 232 of the register 68 may also be stored in internal bank logic 210 in portion 233. A next refresh operation 234 (after the second FGR 1× mode refresh operation 224) may be performed on the row address 011 stored in the portion 232 of the register 68.

The row address 011 in portion 232 of the register 68 may then be incremented to row address 100 as shown in portion 236. Moreover, the bank control blocks 22 may internally increment (as shown by arrow 235) the row address 011 stored in the internal bank logic 210 at the portion 233 to 011 by flipping the least significant bit (to 1) and store the row address 011 in internal bank logic 210 (as shown in portion 237). However, because the row address 011 already has a least significant bit of 1, flipping the least significant bit of 011 to 1 does not change the value of the row address 011.

As such, the row address 100 in portion 236 of the register 68 is not stored in the internal bank logic 210, as indicated by crossed-out arrow 239. A subsequent refresh operation 238 (after the refresh operation 234) may be performed on the row address 011 stored in the portion 237 of the internal bank logic 210. Thus, the row addresses 010 and 100, despite being stored in the register 68 in portions 226 and 236, may not be refreshed by the bank control blocks 22. Skipping refresh operations on one or more rows may result in possible memory leakage and/or lost data associated with those rows (e.g., Rows 010 and 100).

Instead, the command interface 14, the external controller 17, at least some of the bank control blocks 22, or the like, may prevent or block incrementing row address 001 (as shown in portion 207) to row address 010 (as shown in portion 226) in the register 68. This way, the bank control blocks 22 may perform the first FGR 1× mode refresh operation 216 to refresh row address 001, the bank control blocks 22 may perform the second FGR 1× mode refresh operation 224 to refresh row address 001, and the bank control blocks 22 may increment the row address 001 in the register 68 to row address 010, which may be the next row to be refreshed. In this manner, the memory device 10 may not skip refreshing a row (e.g., Row 010), reducing memory leakage and/or lost data.

Figure 9:
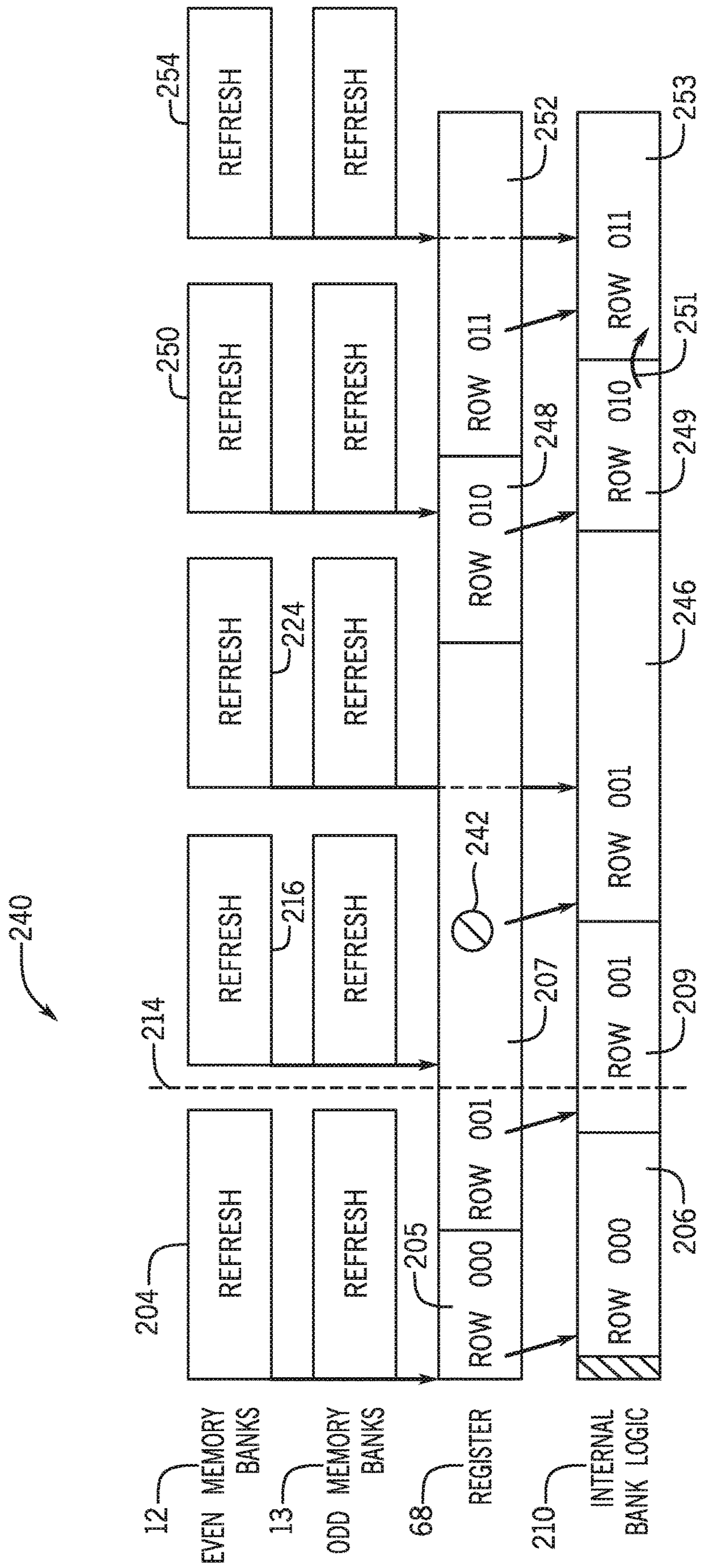
FIG. 9 is an example timing diagram illustrating the memory device of FIG. 1 violating the specification of performing two refresh operations before transitioning from operating in the FGR 2× mode to operating in the FGR 1× mode or the self-refresh mode, while maintaining refresh operations of the memory banks of the memory device, according to an embodiment of the present disclosure.

FIG. 9 is an example timing diagram 240 illustrating the memory device 10 of FIG. 1 violating the specification of performing two refresh operations before transitioning from operating in the FGR 2× mode to operating in the FGR 1× mode or the self-refresh mode, while maintaining refresh operations of the memory banks 11, according to an embodiment of the present disclosure. As illustrated, after the memory device 10 transitions from operating in the FGR 2× mode to operating in the FGR 1× mode (as indicated by dashed line 214) after a first FGR 2× mode refresh operation is performed and a second FGR 2× mode refresh operation is not performed, violating the specification, the command interface 14, the external controller 17, at least some of the bank control blocks 22, or the like, may prevent or block (as indicated by 242) incrementing row address 001 (as shown in portion 207) to row address 010 (as shown in portion 226 in FIG. 8) in the register 68.

The bank control blocks 22 may perform the first FGR 1× mode refresh operation 216 to refresh row address 001 (as shown in portion 207). The row address 001 may be stored in internal bank logic 210 in portion 209. The command interface 14, the external controller 17, the bank control blocks 22, or the like, may prevent or block incrementing row address 001 in portion 207 of the register 68 to row address 010. As a result, when the bank control blocks 22 perform the second FGR 1× mode refresh operation 224, the row address 001 may be refreshed (again). The same row address 001 may again be stored in internal bank logic 210 in portion 246. The bank control blocks 22 may then increment the row address 001 in the register 68 (in the portion 207) to row address 010 (as shown in portion 248). The row address 010 stored in portion 248 of the register 68 may also be stored in internal bank logic 210 in portion 249. Thus, a next refresh operation 250 may be performed (after the second FGR 1× mode refresh operation 224) on the row address 010 stored in the portion 248 of the register 68.

The row address 010 in portion 248 of the register 68 may then be incremented to row address 011 as shown in portion 252. Moreover, the bank control blocks 22 may internally increment (as shown by arrow 251) the row address 010 stored in the internal bank logic 210 at the portion 249 to 011 by flipping the least significant bit (to 1) and store the row address 011 in internal bank logic 210 (as shown in portion 253). In additional or alternative embodiments, the bank control blocks 22 may store the row address 011 in portion 248 of the register 68 in the portion 253 of the internal bank logic 210. A subsequent refresh operation 254 (after the refresh operation 250) may thus be performed on the row address 011 stored in the portion 253 of the internal bank logic 210 or the portion 252 of the register 68. In this manner, the memory device 10 may not skip refreshing a row (e.g., Row 010), reducing memory leakage and/or lost data.

Figure 10:
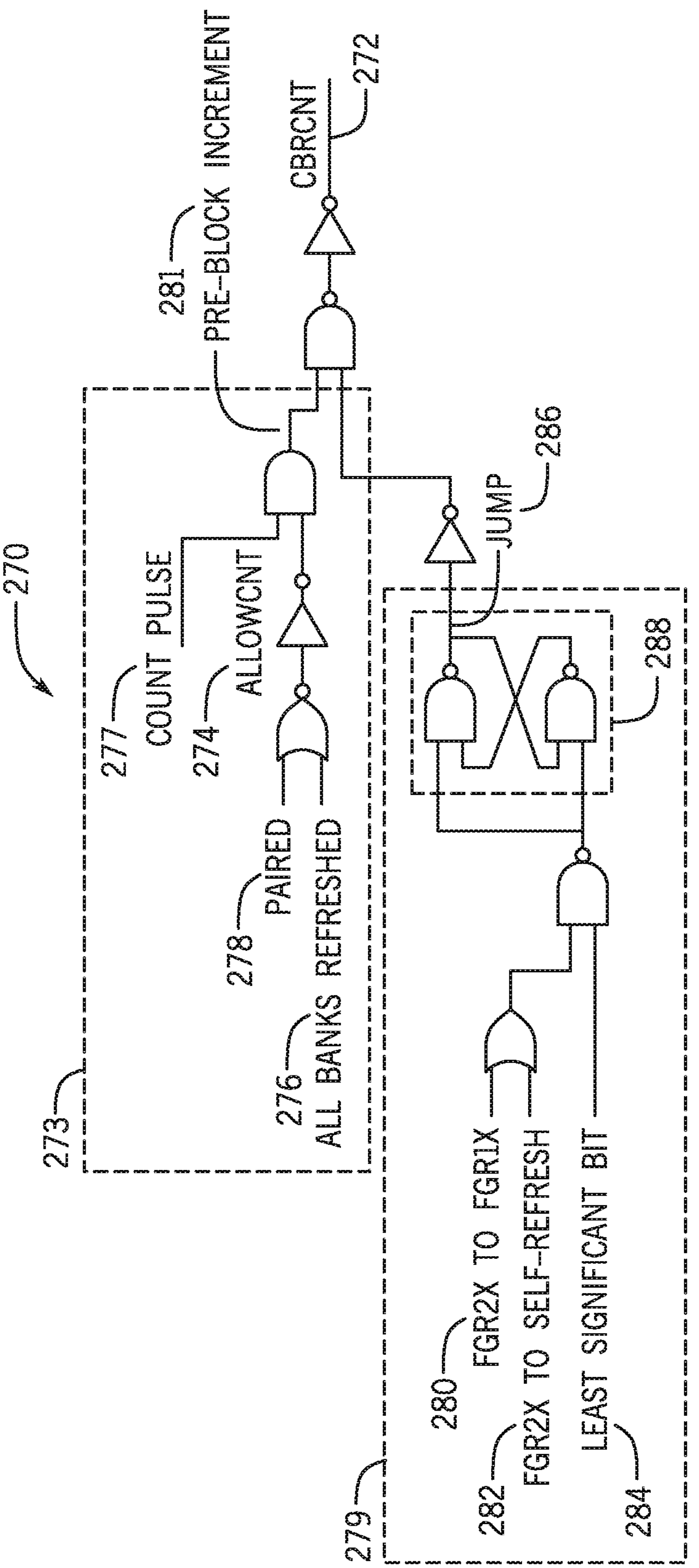
FIG. 10 is a circuit diagram of logic or increment blocking circuitry that may maintain refresh operations of the memory banks of the memory device of FIG. 1, according to an embodiment of the present disclosure.

FIG. 10 is a circuit diagram of logic or increment blocking circuitry 270 that may maintain refresh operations of the memory banks 11 of the memory device 10 of FIG. 1, according to an embodiment of the present disclosure. The increment blocking circuitry 270 may be incorporated in a counter, such as the even bank refresh counter 52 and/or the odd bank refresh counter 54, or in any other suitable portion of the row address output circuit 50, the command address input circuit 21, the command interface 14, and the like. In particular, the increment blocking circuitry 270 may block or prevent a counter, such as the even bank refresh counter 52 or the odd bank refresh counter 54, from incrementing.

As illustrated, an incrementing signal, CBRCNT 272, may be output from the increment blocking circuitry 270 to a counter, such as the even bank refresh counter 52 or the odd bank refresh counter 54. In particular, the counter may increment in response to CBRCNT 272 being pulsing high.

The increment blocking circuitry 270 may include first or "increment determination" circuitry 273 that may determine whether to increment the counter. As illustrated, the increment determination circuitry 273 outputs an increment allowed signal, AllowCNT 274, which may indicate when to increment the counter. Specifically, when a $REF_{ab}$ command is issued, as indicated by a refresh all banks signal, AllBanksRefreshed 276, AllowCNT 274 may provide a high value. Similarly, when two $REF_{sb}$ commands are paired (e.g., when a $REF_{sb}$(Even) command 58 is followed by a $REF_{sb}$(Odd) command 60, or vice versa), as indicated by a paired signal, Paired 278, AllowCNT 274 may provide a high value. AllowCNT 274 may be combined with a count pulse signal 277 that may provide a pre-block incrementing signal 281 to increment the counter assuming the signal 281 is not blocked. As such, when AllowCNT 274 is high and the count pulse signal 277 pulses high, the pre-block incrementing signal 281 may be pulsed high.

The increment blocking circuitry 270 may include second or "blocking determination" circuitry 279 that may determine whether to block the pre-block incrementing signal 281. That is, when the memory device 10 violates the specification of performing a multiple of two refresh operations before transitioning from operating in the FGR 2× mode to operating in the FGR 1× mode or the self-refresh mode, the blocking determination circuitry 279 may determine the pre-block incrementing signal 281 should be blocked. In particular, a first mode transition signal, FGR2×-to-FGR1× 280, may indicate when the memory device 10 transitions from the FGR 2× mode to the FGR 1× mode. A second mode transition signal, FGR2×-to-Self-Refresh 282, may indicate when the memory device 10 transitions from the FGR 2× mode to the self-refresh mode.

If the least significant bit of the row address, as indicated by a bit signal, LeastSignificantBit 284, is high when transitioning from operating in the FGR 2× mode to operating in the FGR 1× mode or the self-refresh mode (as indicated by FGR2×-to-FRG1× 280 and/or FGR2×-to-Self-Refresh 282), then the specification has been violated. Alternatively, if LeastSignificantBit 284 is low when transitioning from operating in the FGR 2× mode to operating in the FGR 1× mode or the self-refresh mode, the specification has not been violated.

If the specification has been violated, an output (e.g., Jump 286) of latch 288 of the blocking determination circuitry 279 is high. Jump 286, when high, may block propagating the pre-block incrementing signal 281 (e.g., flipping the high value to a low value such that the pre-block incrementing signal 281 does not propagate to CBRCNT 272). In this manner, the memory device 10 may avoid skipping a refresh operation for a row, reducing memory leakage and/or lost data. After blocking the pre-block increment signal 281 for a delay time (e.g., associated with a refresh period), Jump 286 may change to a low value, thus enabling the pre-block incrementing signal 281 to propagate to CBRCNT 272, resulting in the counter incrementing.

While the increment blocking circuitry 270, the increment determination circuitry 273, and the blocking determination circuitry 279 are shown as specific logic arranged in a specific configuration, it should be understood that any suitable arrangement of logic may be used that blocks or prevents a counter, such as the even bank refresh counter 52 or the odd bank refresh counter 54, from incrementing. For example, the latch 288 may include any suitable type of storage logic, such as a flip-flop.

Figure 11:
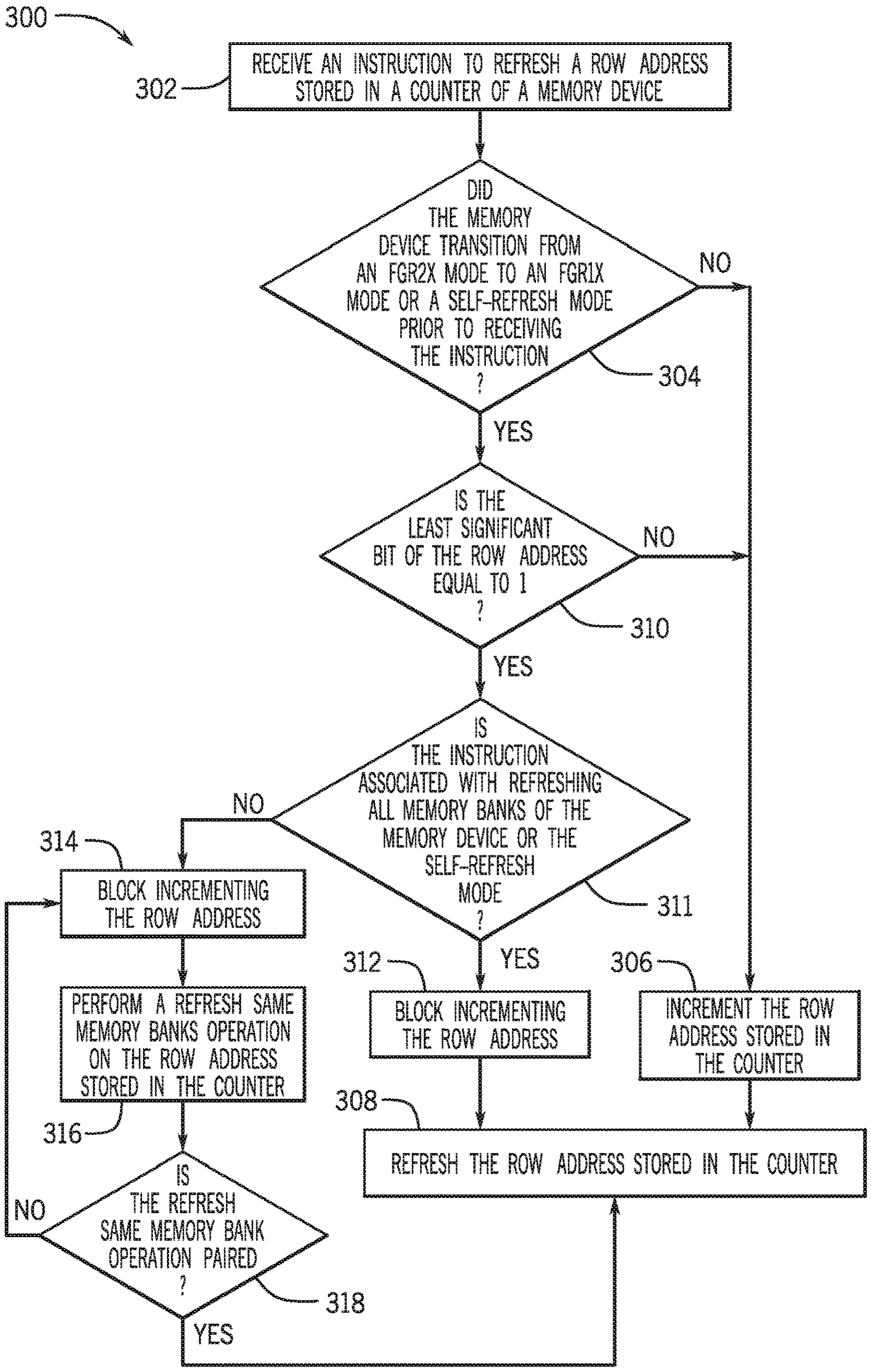
FIG. 11 is a flow diagram of a method for maintaining refresh operations of the memory banks of the memory device of FIG. 1, according to an embodiment of the present disclosure.

FIG. 11 is a flow diagram of a method 300 for maintaining refresh operations of the memory banks 11 of the memory device 10 of FIG. 1, according to an embodiment of the present disclosure. In particular, performing the method 300 may result in the example timing diagram 240 of FIG. 9. The method 300 may be performed by any suitable device or combination of devices that may determine if the memory device 10 transitions from a first mode of operation to a second mode of operation, determine a least significant bit of a row address stored in a counter, and block incrementing the row address. While the method 300 is described using steps in a specific sequence, it should be understood that the present disclosure contemplates that the described steps may be performed in different sequences than the sequence illustrated, and certain described steps may be skipped or not performed altogether. In some embodiments, at least some of the steps of the method 300 may be performed by the increment blocking circuitry 270, as described below. However, it should be understood that any suitable circuitry or component may perform the method 300, such as the row address output circuit 50, the command address input circuit 21, the command interface 14, and the like.

As illustrated, the increment blocking circuitry 270 receives (process block 302) an instruction to refresh a row address stored in a counter, such as the even bank refresh counter 52 and/or the odd bank refresh counter 54, of the memory device 10.

The increment blocking circuitry 270 then determines (decision block 304) whether the memory device 10 transitioned from an FGR 2× mode to an FGR 1× mode or a self-refresh mode prior to receiving the instruction. That is, the increment blocking circuitry 270 may determine whether the memory device 10 is in the FGR 1× mode or the self-refresh mode when it receives the instruction, and whether the increment blocking circuitry 270 was in the FGR 2× mode.

If the increment blocking circuitry 270 determines that the memory device 10 did not transition from the FGR 2× mode to the FGR 1× mode or the self-refresh mode prior to receiving the instruction, the increment blocking circuitry 270 increments (process block 306) the row address stored in the counter. The increment blocking circuitry 270 then refreshes (process block 308) the (incremented) row address stored in the counter.

If the increment blocking circuitry 270 determines that the memory device 10 transitioned from the FGR 2× mode to the FGR 1× mode or the self-refresh mode prior to receiving the instruction, the increment blocking circuitry 270 then determines (decision block 310) whether a least significant bit of the row address equals one (e.g., whether the row address stored in the counter is odd). In particular, if the least significant bit of the row address stored in the counter is zero, then the number of refresh operations during the FGR 2× mode was even (e.g., the number of refresh operations during the FGR 2× mode was a multiple of two or paired). Otherwise, if the least significant bit of the row address is one, then the number of refresh operations during the FGR 2× mode was odd (e.g., the number of refresh operations during the FGR 2× mode was not multiple of two or unpaired) and the specification was violated.

If the increment blocking circuitry 270 determines that the least significant bit of the row address does not equal one (e.g., equals zero), then the increment blocking circuitry 270 increments (process block 306) the row address stored in the counter. The increment blocking circuitry 270 then refreshes (process block 308) the (incremented) row address stored in the counter If the increment blocking circuitry 270 determines that the least significant bit of the row address equals one, the increment blocking circuitry 270 determines (decision block 311) whether the instruction is associated with refreshing all memory banks (e.g., a $REF_{ab}$ command) or operating in the self-refresh mode. If so, the increment blocking circuitry 270 blocks (process block 312) incrementing the row address. In particular, latch 288 may output a signal (e.g., Jump 286) to block another signal that causes incrementing the counter (e.g., the pre-block increment signal 281). The increment blocking circuitry 270 then refreshes (process block 308) the (unincremented) row address stored in the counter.

If the increment blocking circuitry 270 determines that the instruction is not associated with refreshing all memory banks or operating in the self-refresh mode (e.g., a $REF_{sb}$ command in the auto-refresh mode), the increment blocking circuitry 270 blocks (process block 314) incrementing the row address. The increment blocking circuitry 270 may then perform (process block 316) a refresh same memory banks operation (e.g., a $REF_{sb}$ command) on the row address stored in the counter. The increment blocking circuitry 270 may then determine (decision block 318) whether the refresh same memory banks operation is paired. This is because, for refresh same memory banks operations, blocking the incrementation of the counter (e.g., the pre-block increment signal 281 of FIG. 10) may be performed twice—once each for the even memory banks 12 and the odd memory banks 13.

As such, if the refresh same memory banks operation is not paired, the increment blocking circuitry 270 may return to process block 314 to block incrementing the row address. In this manner, incrementing the counter is blocked for both the even memory banks 12 and the odd memory banks 13. If the refresh same memory banks operation is paired, the increment blocking circuitry 270 then refreshes (process block 308) the row address stored in the counter. In this manner, the memory device 10 may avoid skipping a refresh operation for a row, reducing memory leakage and/or lost data.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A method comprising:

receiving a first command to refresh one or more memory banks of a first set of memory banks comprising an odd set of memory banks of a plurality of memory banks;

receiving a second command to refresh one or more memory banks of a second set of memory banks comprising an even set of memory banks of the plurality of memory banks;

receiving a third command to refresh all memory banks of the first set of memory banks and the second set of memory banks wherein the odd set of memory banks comprise every other memory bank that is interleaved between memory banks of an even set of memory banks of the plurality of memory banks;

capturing a first row address stored in a shared memory register based on receiving the first command;

in response to capturing the first row address, refreshing a first row of the first set of memory banks associated with the first row address;

in response to refreshing the first row, internally incrementing, via bank control circuitry associated with the first set of memory banks, the first row address to obtain a second row address independent of contents of the shared memory register and while the shared memory register contains a row address different than the second row address;

in response to incrementing the first row address, refreshing a second row of the first set of memory banks associated with the second row address;

capturing an additional first row address stored in the shared memory register based on receiving the second command, wherein the capturing the first row address and the capturing the additional first row address occur independently;

in response to capturing the additional first row address, refreshing an additional first row of the second set of memory banks associated with the additional first row address;

in response to refreshing the additional first row, internally incrementing, via bank control circuitry associated with the second set of memory banks, the additional first row address to obtain an additional second row address independent of contents of the shared memory register and while the shared memory register contains a row address different than the additional second row address;

in response to incrementing the additional first row address, refreshing an additional second row of the second set of memory banks associated with the additional second row address; and refreshing all memory banks of the first set of memory banks and the second set of memory banks based on receiving the third command.

2. The method of claim 1, wherein the shared memory register stores the first row address in response to receiving the first row address from an output of a multiplexer via a shared address path.

3. The method of claim 1, comprising activating a third row of the second set of memory banks based on refreshing the first row of the first set of memory banks, the second row of the first set of memory banks, or both.

4. The method of claim 1, comprising incrementing a third row address stored in a first bank refresh counter corresponding to the first set of memory banks, or incrementing a fourth row address stored in a second bank refresh counter corresponding to the second set of memory banks based on incrementing the first row address.

5. The method of claim 4, wherein the first bank refresh counter comprises an odd bank refresh counter and the second bank refresh counter comprises an even bank refresh counter.

6. An electronic device, comprising:

a first set of memory banks comprising an odd set of memory banks of a plurality of memory banks, wherein the odd set of memory banks comprises every other memory bank that is interleaved between memory banks of an even set of memory banks of the plurality of memory banks;

a second set of memory banks coupled to the first set of memory banks, wherein the second set of memory banks comprises the even set of memory banks interleaved between the odd set of memory banks; and memory bank control circuitry coupled to the first set of memory banks and the second set of memory banks, the memory bank control circuitry configured to:

receive a first command to refresh one or more memory banks within the first set of memory banks, a second command to refresh one or more memory banks within the second set of memory banks, and a third command to refresh all memory banks in the first set of memory banks and the second set of memory banks;

capture a first row address stored in a shared memory register based on receiving the first command;

in response to capturing the first row address, refresh a first row of the first set of memory banks associated with the first row address;

in response to refreshing the first row, internally increment, via bank control circuitry associated with the first set of memory banks, the first row address to obtain a second row address independent of contents of the shared memory register and while the shared memory register contains a row address different than the second row address;

in response to incrementing the first row address, refresh a second row of the first set of memory banks associated with the second row address;

capture an additional first row address stored in the shared memory register based on receiving the second command, wherein the capturing the first row address and the capturing the additional first row address occur independently;

in response to capturing the additional first row address, refresh an additional first row of the second set of memory banks associated with the additional first row address;

in response to refreshing the additional first row, internally increment, via bank control circuitry associated with the second set of memory banks, the additional first row address to obtain an additional second row address independent of contents of the shared memory register and while the shared memory register contains a row address different than the additional second row address;

in response to incrementing the additional first row address, refresh an additional second row of the second set of memory banks associated with the additional second row address; and refresh all memory banks of the first set of memory banks and the second set of memory banks based on receiving the third command.

7. The electronic device of claim 6, wherein the shared memory register is coupled to an output of a multiplexer.

8. The electronic device of claim 7, wherein an even bank refresh counter and an odd bank refresh counter are coupled to respective inputs of the multiplexer.

9. The electronic device of claim 8, wherein the memory bank control circuitry is configured to increment a third row address stored in the even bank refresh counter or increment a fourth row address stored in an odd bank refresh counter based on incrementing the first row address.

10. The electronic device of claim 6, wherein the memory bank control circuitry is configured to activate a third row address of the second set of memory banks based on refreshing the first row of the first set of memory banks or refreshing the second row of the first set of memory banks.

11. The electronic device of claim 6, wherein the second set of memory banks is coupled to the first set of memory banks via a shared address path.

12. Tangible, non-transitory, computer-readable media, comprising instructions that, when executed, cause one or more processors to:

receive a first command to refresh one or more memory banks of a first set of memory banks comprising an odd set of memory banks of a plurality of memory banks, receive a second command to refresh one or more memory banks of a second set of memory banks comprising an even set of memory banks, and receive a third command to refresh all memory banks of the first set of memory banks and the second set of memory banks wherein the odd set of memory banks comprises every other memory bank that is interleaved between memory banks of an even set of memory banks of the plurality of memory banks;

capture a first row address stored in a shared memory register based on receiving the first command;

in response to capturing the first row address, refresh a first row of the first set of memory banks associated with the first row address;

in response to refreshing the first row, internally increment, via bank control circuitry associated with the first set of memory banks, the first row address to obtain a second row address independent of contents of the shared memory register and while the shared memory register contains a row address different than the second row address;

in response to incrementing the first row address, refresh a second row of the first set of memory banks associated with the second row address;

capture an additional first row address stored in the shared memory register based on receiving the second command, wherein the capturing the first row address and the capturing the additional first row address occur independently;

in response to capturing the additional first row address, refresh an additional first row of the second set of memory banks associated with the additional first row address;

in response to refreshing the additional first row, internally increment, via bank control circuitry associated with the second set of memory banks, the additional first row address to obtain an additional second row address independent of contents of the shared memory register and while the shared memory register contains a row address different than the additional second row address;

in response to incrementing the additional first row address, refresh an additional second row of the second set of memory banks associated with the additional second row address; and refresh all memory banks of the first set of memory banks and the second set of memory banks based on receiving the third command.

13. The tangible, non-transitory, computer-readable media of claim 12, comprising instructions that, when executed, cause the one or more processors to activate a third row of the second set of memory banks based on refreshing the first row of the first set of memory banks, refreshing the second row of the first set of memory banks, or both.

14. The tangible, non-transitory, computer-readable media of claim 12, comprising instructions that, when executed, cause the one or more processors to increment a third row address stored in a first bank refresh counter corresponding to the first set of memory banks, or increment a fourth row address stored in a second bank refresh counter corresponding to a second set of memory banks based on incrementing the first row address.

* * * * *